US 6,678,187 B2

(12) United States Patent
Sugibayashi et al.

(10) Patent No.: US 6,678,187 B2
(45) Date of Patent: Jan. 13, 2004

(54) SEMICONDUCTOR MEMORY APPARATUS USING TUNNEL MAGNETIC RESISTANCE ELEMENTS

(75) Inventors: Tadahiko Sugibayashi, Tokyo (JP); Noboru Sakimura, Tokyo (JP); Takeshi Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 164 days.

(21) Appl. No.: 10/046,811

(22) Filed: Jan. 15, 2002

(65) Prior Publication Data

US 2002/0126524 A1 Sep. 12, 2002

(30) Foreign Application Priority Data

Jan. 16, 2001 (JP) .................................... 2001-007946

(51) Int. Cl.7 .............................................. G11C 11/00
(52) U.S. Cl. ...................... 365/158; 365/171; 365/173
(58) Field of Search ................................ 365/158, 171, 365/173, 230.07; 257/421

(56) References Cited

U.S. PATENT DOCUMENTS

| 5,640,343 | A | | 6/1997 | Gallagher et al. |
| 6,504,751 | B2 | * | 1/2003 | Poechmueller ............. 365/158 |
| 6,608,776 | B2 | * | 8/2003 | Hidaka ...................... 365/171 |
| 2002/0044481 | A1 | * | 4/2002 | Hidaka ...................... 365/158 |

FOREIGN PATENT DOCUMENTS

| JP | 60-034086 | 2/1985 |
| JP | 06-089568 | 3/1994 |
| JP | 07-141881 | 6/1995 |
| JP | 11-066877 | 3/1999 |
| JP | 11-086528 | 3/1999 |
| JP | 11-251548 | 9/1999 |
| JP | 2000-132961 | 5/2000 |
| JP | 2000-196030 | 7/2000 |

* cited by examiner

*Primary Examiner*—Richard Elms
*Assistant Examiner*—Nam Nguyen
(74) *Attorney, Agent, or Firm*—Scully, Scott, Murphy & Presser

(57) ABSTRACT

A semiconductor memory apparatus using tunnel magnetic resistance elements comprises a plurality of cell arrays. When data is read from a cell in one of the cell array, a word line connected to the cell is connected to a voltage source, a bit line connected to the cell is connected to an input of a sense amplifier, word lines in the cell array concerned except for the word line connected to the cell and bit lines in the cell array concerned except for the bit line connected to the cell are isolated. A subtracter subtracts an offset current which is generated in another cell array from a current flowing from the bit line connected the cell. An integrator integrates the result of the subtraction. A comparator, a read current value register, and a reference value register performs self-reference reading method on the result of the integration.

26 Claims, 23 Drawing Sheets

SELECTED CELL
MAGNETIZATION
REVERSIBLE

NON-SELECTED CELL
MAGNETIZATION
UNREVERSIBLE

NON-SELECTED CELL
MAGNETIZATION
UNREVERSIBLE

ARRSELXm: X DIRECTION CELL ARRAY SELECTION SIGNAL LINE
TERMACTXm: X DIRECTION TERMINATION ACTIVATION SIGNAL LINE
Vterm-X: TERMINATION VOLTAGE LINE
YSWj: BIT SELECTION SIGNAL LINE
GBLn: GLOBAL BIT LINE
WLi: WORD LINE
BLj: BIT LINE ARRSELYn: Y DIRECTION CELL ARRAY SELECTION SIGNAL LINE
TERMACTYn: Y DIRECTION TERMINATION ACTIVATION SIGNAL LINE
Vterm-Y: TERMINATION VOLTAGE LINE
XSWi: WORD SELECTION SIGNAL LINE
GWLm: GLOBAL WORD LINE
WLi: WORD LINE
BLj: BIT LINE XSW: WORD SELECTION SIGNAL LINE
XSWB: WORD NON-SELECTION SIGNAL LINE
YSW: BIT SELECTION SIGNAL LINE
YSWB: BIT NON-SELECTION SIGNAL LINE
WL: WORD LINE
BL: BIT LINE

"1" IS WRITTEN.

"0" IS WRITTEN.

FIG.23

| Y TERM | Y TERM | Y TERM | Y TERM |
|---|---|---|---|
| X TERM \| X SEL | X SEL \| X TERM | X TERM \| X SEL | X SEL \| X TERM |
| Y SEL | Y SEL | Y SEL | Y SEL |
| Y SEL | Y SEL | Y SEL | Y SEL |
| X TERM \| X SEL | X SEL \| X TERM | X TERM \| X SEL | X SEL \| X TERM |
| Y TERM | Y TERM | Y TERM | Y TERM |
| Y TERM | Y TERM | Y TERM | Y TERM |
| X TERM \| X SEL | X SEL \| X TERM | X TERM \| X SEL | X SEL \| X TERM |
| Y SEL | Y SEL | Y SEL | Y SEL |
| Y SEL | Y SEL | Y SEL | Y SEL |
| X TERM \| X SEL | X SEL \| X TERM | X TERM \| X SEL | X SEL \| X TERM |
| Y TERM | Y TERM | Y TERM | Y TERM |

CELL ARRAY

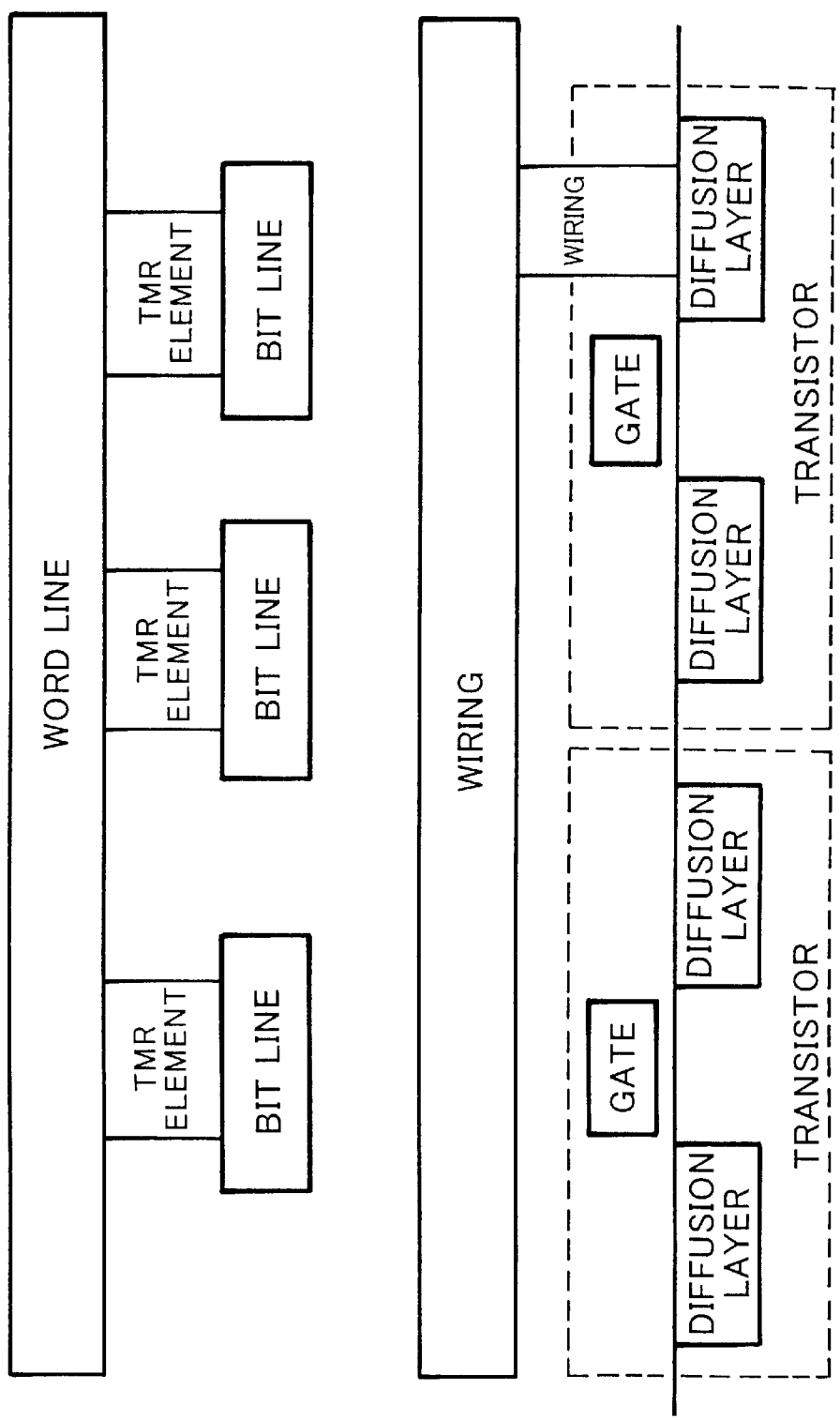

SEMICONDUCTOR MEMORY APPARATUS USING TUNNEL MAGNETIC RESISTANCE ELEMENTS

BACKGROUND OF THE INVENTION

1. Field of the Invention

The present invention relates to a semiconductor memory apparatus using tunnel magnetic resistance elements as memory cells. Hereinafter, the tunnel magnetic resistance element is referred to as TMR element or simply cell. In addition, the semiconductor memory apparatus using the TMR elements is referred to as MRAM.

2. Description of the Prior Art

FIG. 1 shows the theory of an TMR element. The TMR element is composed of a free magnetic substance layer 901, a tunnel insulation film 902, and a pin magnetic substance layer 903 that are successively disposed. The amount of a current that flows in the tunnel insulation film 902 varies depending on the orientation of the magnetization of the free magnetic substance layer 901. A larger current or a smaller current is assigned "1" whereas the other current is assigned "0". The orientation of the pin magnetic substance layer 903 has been fixed from the time the device was produced.

With reference to FIGS. 2 and 3A, when data is written to a selected cell 913, a current 911C and a current 912C are caused to flow in a selected word line 911 and a selected bit line 912, respectively. At that point, a magnetic field denoted by an arrow mark 931 is applied to the selected cell 913. A magnetic field denoted by an arrow 932 is applied to cells 914 connected to the selected word line 921 other than the cell 913. A magnetic field denoted by an arrow 933 is applied to cells 915 connected to the selected bit line 922 other than the cell 913. A magnetic substance (for example, NiFe) that has asteroid characteristic in which the orientation of the magnetization is easily reversed with a magnetic field applied in a diagonal direction as shown in FIG. 3A is used as the cells. In FIG. 3A, a diamond shape 934 represents the intensity of the magnetic field with which the orientation of the magnetization of the magnetic substance is reversed. Thus, only the selected cell 913 is magnetized in a desired orientation.

FIG. 4 is a schematic diagram showing an MRAM disclosed in U.S. Pat. No. 5,640,343 (hereinafter referred to as first related art reference).

Referring to FIG. 4, a diode 941 is connected to a TMR element 942 in series. The TMR element 942 is denoted by a symbol of a resistor, because the resistance when the value of data written to the TMR element 942 is "1" is different from the resistance when the value of data written thereto is "0", As shown in FIG. 4, a tunnel current flows in only a selected cell 943. By comparing the current with a reference current, the orientation of the magnetization of the cell (namely, the cell data) is determined.

FIG. 5 is a schematic diagram showing the concept of an MRAM disclosed in Applied Physics Letters Vol. 77, Num. 13, Sep. 25, 2000 (hereinafter referred to as second related art reference). The MRAM as the second related art reference does not have diodes. Lines other than a selected word line and a selected bit line are grounded. A current is caused to flow in only the selected word line and the selected bit line.

In the first related art reference, since a diode must be connected to a magnetic substance in series, the number of production steps increases. Thus, the production cost rises.

In addition, in the first related art reference, it is necessary to apply two types of voltage to each bit line and each word line. On the other hand, in the second related art reference, it is necessary to apply two types of voltage to each word line. Thus, the structure of a switch for selecting the voltages becomes complicated.

Moreover, in the second related art reference, since non-selected lines are fixed to a ground line of the chip. Thus, noise of the ground line adversely affects a signal. In other words, when there is an alternate noise voltage between a ground line of a sense amplifier and a ground line connected to a non-selected line, an alternate noise current flows in the sense amplifier.

SUMMARY OF THE INVENTION

An object of the present invention is to provide an MRAM that needs not a process for forming diodes, thereby allowing the chip size to be decreased and the production cost to be reduced.

Another object of the present invention is to provide an MRAM that prevents the areas of the selectors and sense amplifiers of the chip from increasing, thereby allowing the chip size to be decreased and the production cost to be lowered.

A further object of the present invention is to provide an MRAM that prevents a noise current due to ground noise from flowing in an input portion of a sensor amplifier, thereby preventing a read error from taking place.

According to the present invention, there is provided a semiconductor memory apparatus using tunnel magnetic resistance elements, the apparatus comprising: a plurality of cell arrays, each of the cell arrays having a plurality of word lines, a plurality of bit lines each of which intersects with the plurality of word lines, and a plurality of tunnel magnetic resistance elements connected between respective word lines and respective bit lines at the intersections thereof; means, when data is read, for connecting a read word line, which is a word line connected to a tunnel magnetic resistance element from which the data is read, to a voltage source of a first voltage; means, when the data is read, for connecting a read bit line, which is a bit line connected to the tunnel magnetic resistance element from which data is read, to an input of a sense amplifier having an input voltage that is a second voltage that is different from the first voltage; means, when the data is read, for causing word lines, except for the read word line, in a first cell array that contains the tunnel magnetic resistance element from which data is read to be in a floating state; and means, when the data is read, for causing bit lines, except for the read bit line, in the first cell array to be in a floating state.

The semiconductor memory apparatus may further comprise: a subtracter for subtracting an offset current from a current that flows to or from the sense amplifier when the data is read.

In the semiconductor memory apparatus, the offset current may flow in a dummy cell.

In the semiconductor memory apparatus, the dummy cell is included in a second cell array that is different from the first cell array.

In the semiconductor memory apparatus, the second cell array may be a cell array dedicated for generating the offset current.

In the semiconductor memory apparatus, in the second cell array, tunnel magnetic resistance elements to which "0" has been written and tunnel magnetic resistance elements to which "1" has been written may be arranged in a checker shape.

In the semiconductor memory apparatus, in the second cell array, tunnel magnetic resistance elements to which "0" has been written and tunnel magnetic resistance elements to which "1" has been written may be arranged in a stripe pattern.

In the semiconductor memory apparatus, in the second cell array, the difference between the number of tunnel magnetic resistance elements to which "0" has been written and the number of tunnel magnetic resistance elements to which "1" has been written may be 1 or less.

In the semiconductor memory apparatus, the second cell array may be a cell array that contains a tunnel magnetic resistance element from and to which data is read and written.

In the semiconductor memory apparatus, the second cell array may have a dummy word line and a dummy bit line, and a current that flows in the dummy bit line may be used as the offset current when the dummy word line is connected to the voltage source of the first voltage, the dummy bit line is connected to the subtracter, word lines that are contained in the second cell array and that are not the dummy word line are caused to be in a floating state, and bit lines that are contained in the second cell array and that are not the dummy bit line are caused to be in a floating state.

In the semiconductor memory apparatus, the difference between the number of tunnel magnetic resistance elements to which "0" has been written and that are connected to the dummy word line and the number of tunnel magnetic resistance elements to which "1" has been written and that are connected to the dummy word line may be 1 or less.

In the semiconductor memory apparatus, the difference between the number of tunnel magnetic resistance elements to which "0" has been written and that are connected to the dummy bit line and the number of tunnel magnetic resistance elements to which "1" has been written and that are connected to the dummy bit line may be 1 or less.

In the semiconductor memory apparatus, the second cell array may have a dummy word line, and a current that flows in the bit line connected to the subtracter may be used as the offset current when the dummy word line is connected to the voltage source of the first voltage, any one bit line of the second cell array is connected to the subtracter, word lines that are contained in the second cell array and that are not the dummy word line are caused to be in a floating state, and bit lines that are contained in the second cell array and that are not the bit line connected to the subtracter are caused to be in a floating state.

In the semiconductor memory apparatus, the difference between the number of tunnel magnetic resistance elements to which "0" has been written and that are connected to the dummy word line and the number of tunnel magnetic resistance elements to which "1" has been written and that are connected to the dummy word line may be 1 or less.

In the semiconductor memory apparatus, the second cell array may nave a dummy bit line, and a current that flows in the dummy bit line may be used as the offset current when any one word line contained in the second cell array is connected to the voltage source of the first voltage, the dummy bit line is connected to the subtracter, word lines that are contained in the second cell array and that are not connected to the voltage source of the first voltage are caused to be in a floating state, and bit lines that are contained in the second cell array and that are not the dummy bit line are caused to be in a floating state.

In the semiconductor memory apparatus, the difference between the number of tunnel magnetic resistance elements to which "0" has been written and that are connected to the dummy bit line and the number of tunnel magnetic resistance elements to which "1" has been written and that are connected to the dummy bit line may be 1 or less.

The semiconductor memory apparatus, may further comprise: an integrator for integrating a current that flows to or from the sense amplifier.

The semiconductor memory apparatus, may further comprise: means for performing a self-reference reading method.

In the semiconductor memory apparatus, before the data is read, each word line and each bit line may bee pre-charged at a third voltage that is different from the first voltage and the second voltage.

In the semiconductor memory apparatus, the third voltage may be represented by:

$$(nV1+mV2)/(m+n)$$

where V1 represents the first voltage; V2 represents the second voltage; m represents the number of word lines per cell array; and n represents the number of bit lines per cell array.

The semiconductor memory apparatus may further comprise: means, when data is written, for causing the voltage of each word line and each bit line to be a third voltage that is different from the first voltage and the second voltage.

In the semiconductor memory apparatus, the third voltage may be represented by:

$$(nV1+mV2)/(m+n)$$

where V1 represents the first voltage; V2 represents the second voltage; m represents the number of word lines per cell array; and n represents the number of bit lines per cell array.

In the semiconductor memory apparatus, the direction of a current that flows in a word line connected to a tunnel magnetic resistance element to which "1" is written may be reverse to the direction of a current that flows in a word line connected to a tunnel magnetic resistance element to which "0" is written, and the direction of a current that flows in a bit line connected to a tunnel magnetic resistance element to which "1" is written may be reverse to the direction of a current that flows in a bit line connected to a tunnel magnetic resistance element to which "0" is written.

In the semiconductor memory apparatus, a selector and a termination circuit of word lines or bit lines may be overlapped with the tunnel magnetic resistance elements.

In the semiconductor memory apparatus, the sense amplifier may be shared by a plurality of cell arrays.

In the semiconductor memory apparatus, the voltage source of the first voltage may be disposed adjacent to the sense amplifier.

These and other objects, features and advantages of the present invention will become more apparent in light of the following detailed description of the best mode embodiment thereof, as illustrated in the accompanying drawings.

BRIEF DESCRIPTION OF DRAWINGS

FIG. 23 is a plan view showing the physical structure of the MRAM according to the embodiment of the present invention; and FIG. 24 is a sectional view showing the physical structure of the MRAM according to the embodiment of the present invention.

DESCRIPTION OF THE PREFERRED EMBODIMENTS

Figure 1:
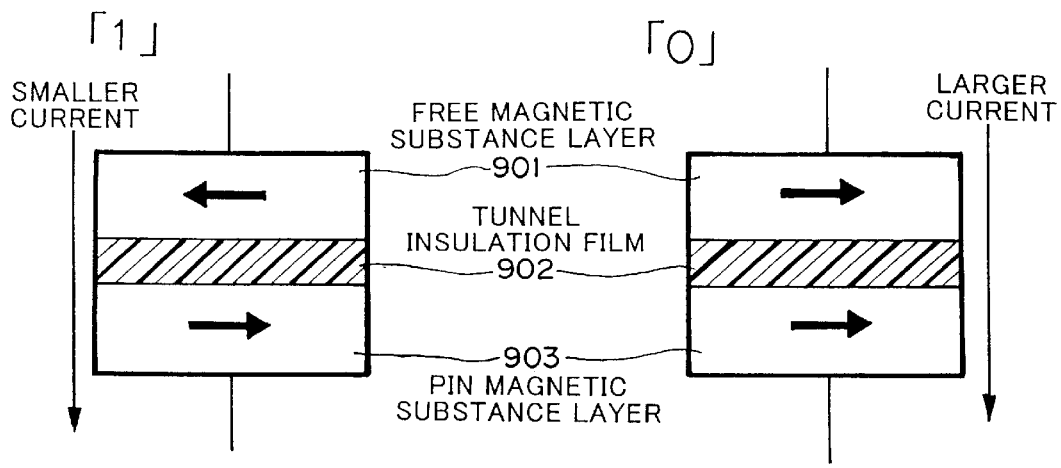
FIG. 1 is a sectional view for explaining the theory of an TMR element.
Figure 2:
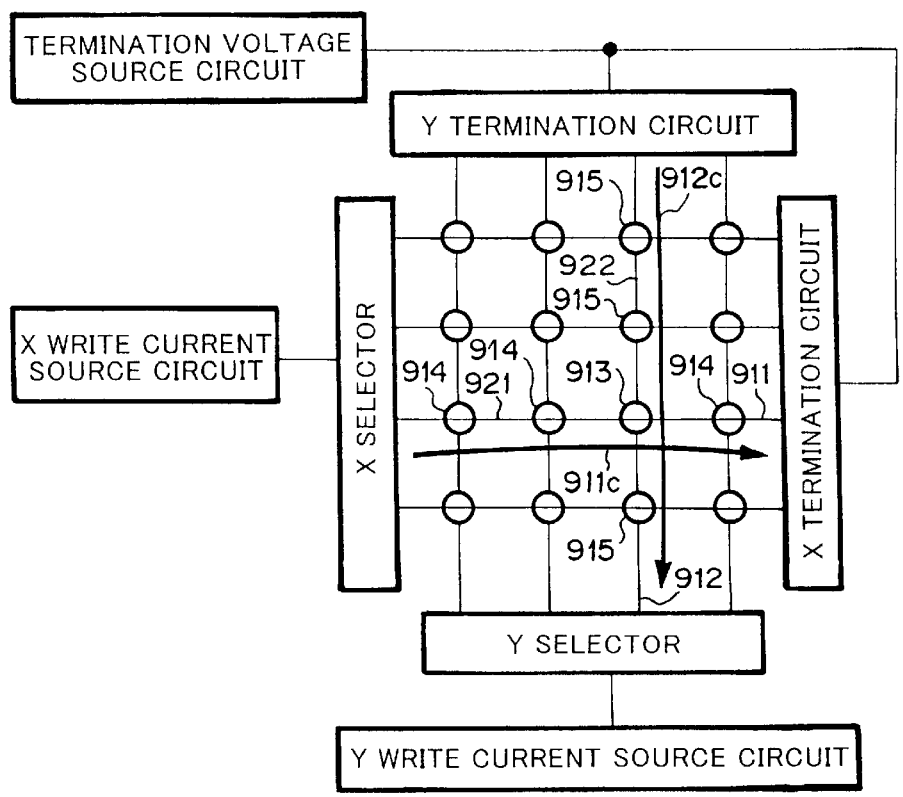
FIG. 2 is a schematic diagram for explaining the theory of operation of an MRAM using TMR elements.
Figure 3A:
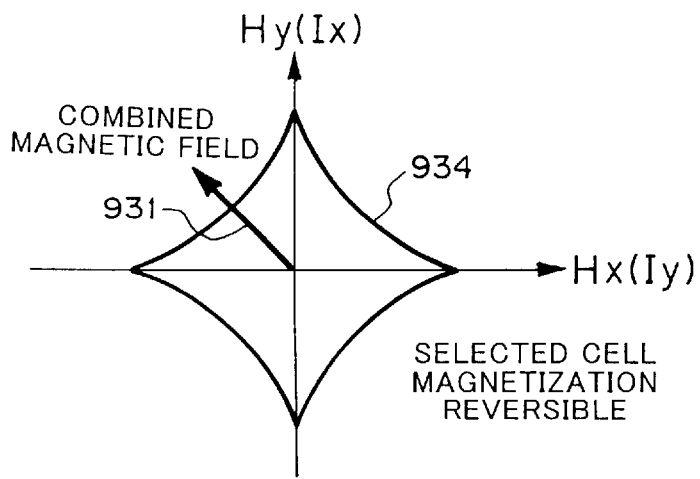
FIGS. 3A, 3B, and 3C are schematic diagrams showing an asteroid characteristic of an TMR element and a magnetic field vector thereof.
Figure 3B:
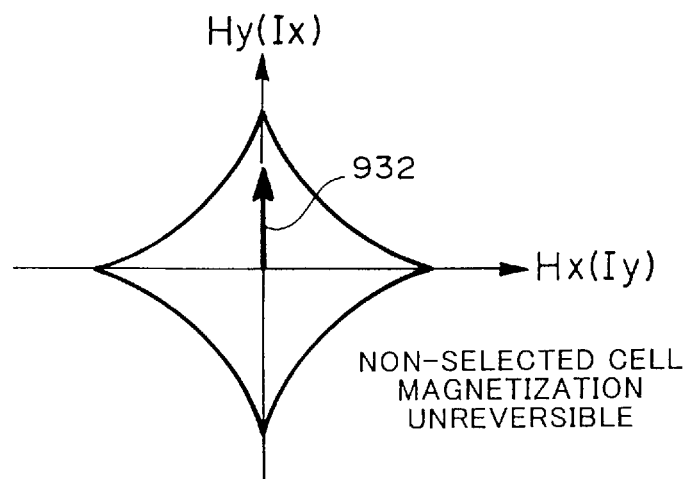
Figure 3C:
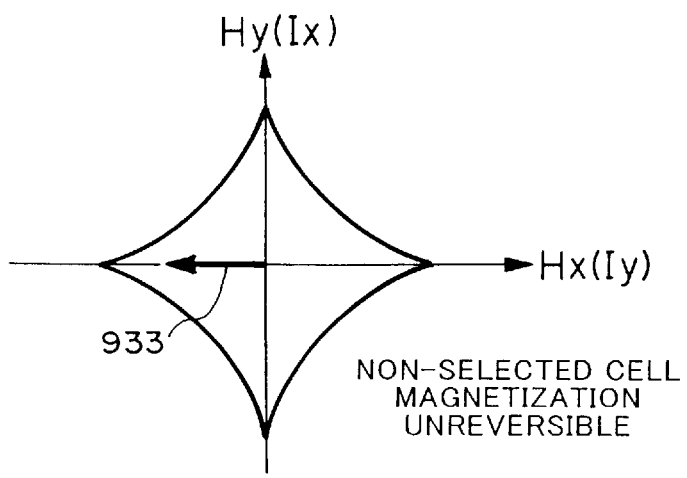
Figure 4:
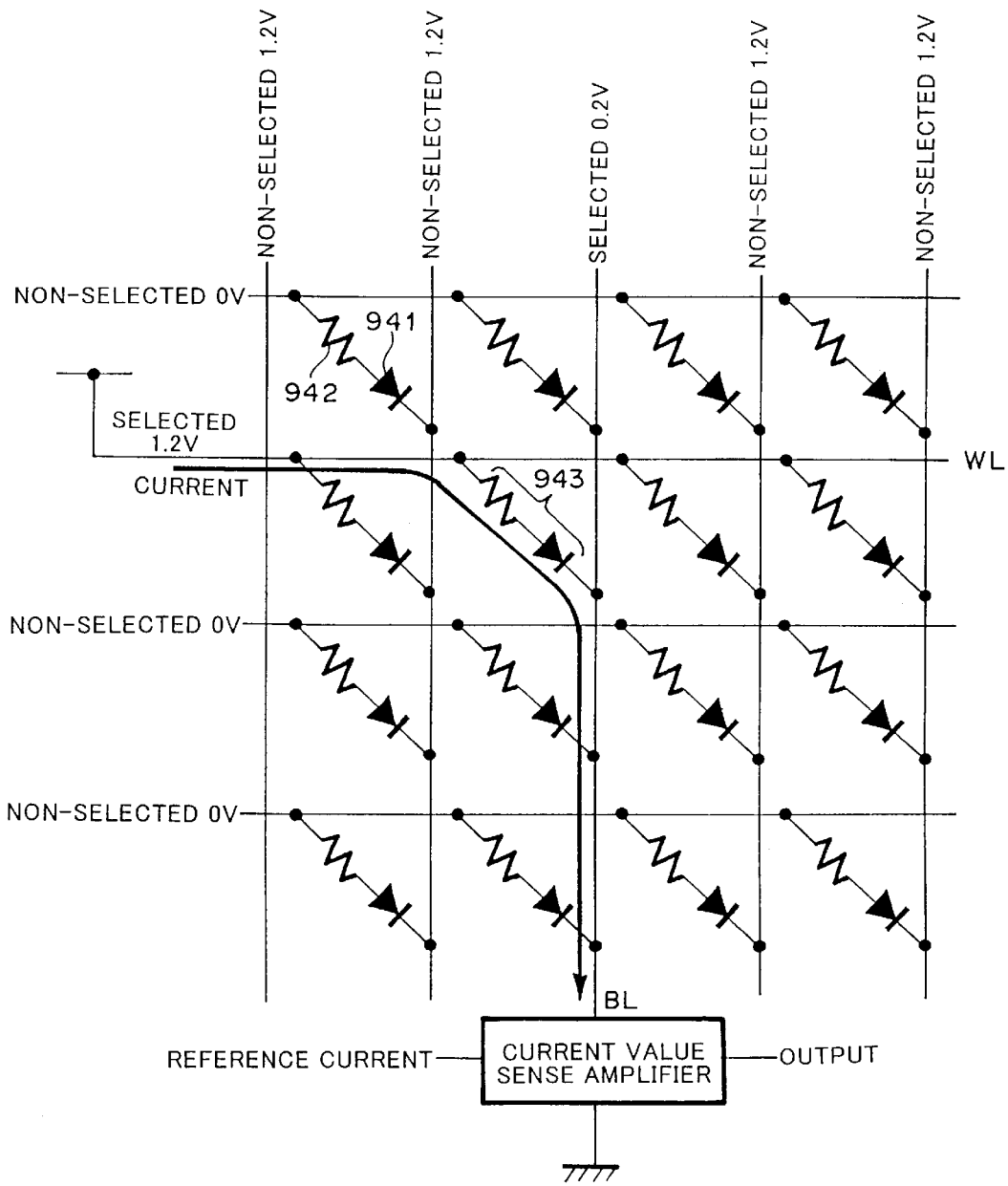
FIG. 4 is a schematic diagram showing the structure of an MRAM according to a first related art reference.
Figure 5:
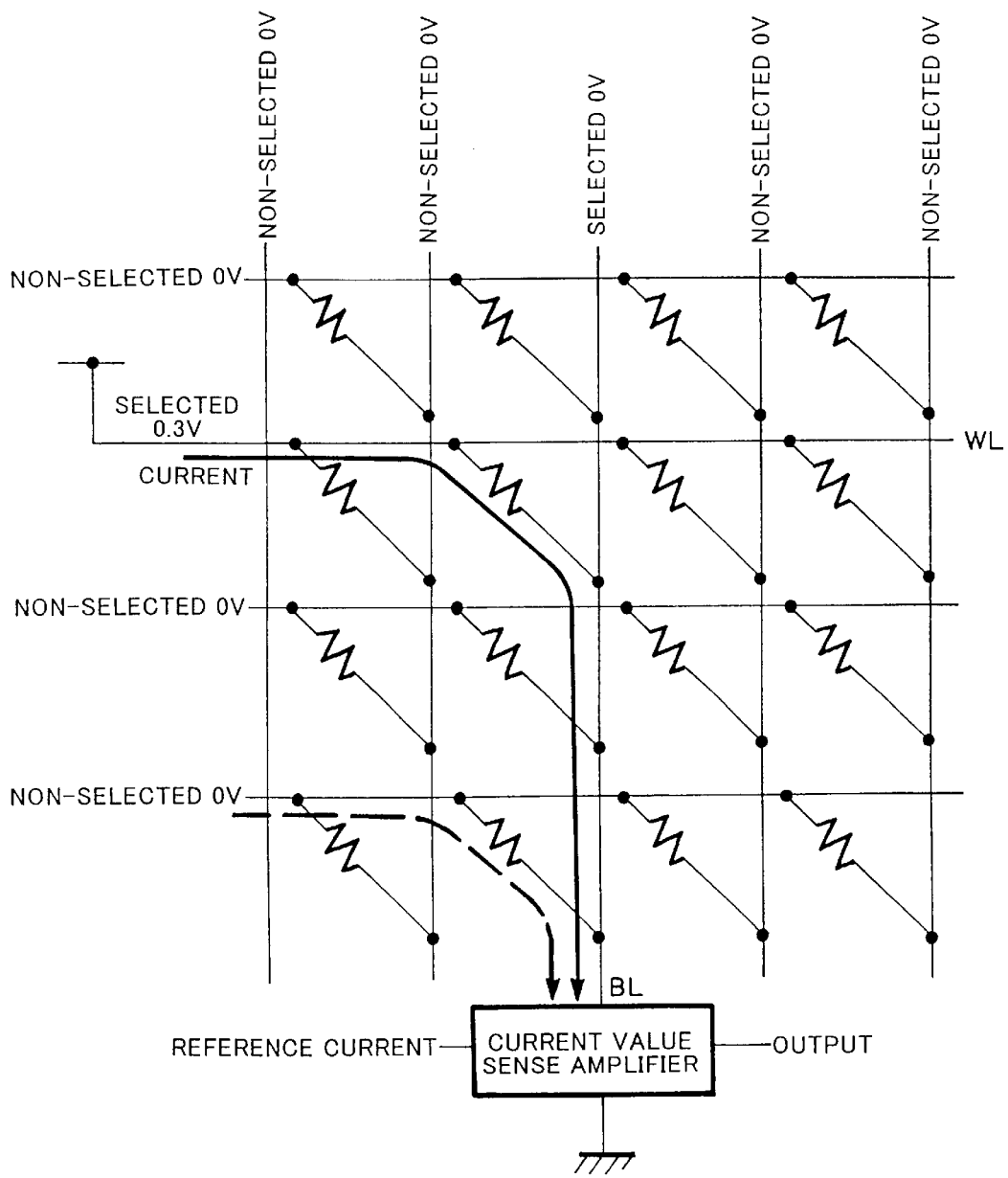
FIG. 5 is a schematic diagram showing the structure of an MRAM according to a second related art reference.
Figure 6:
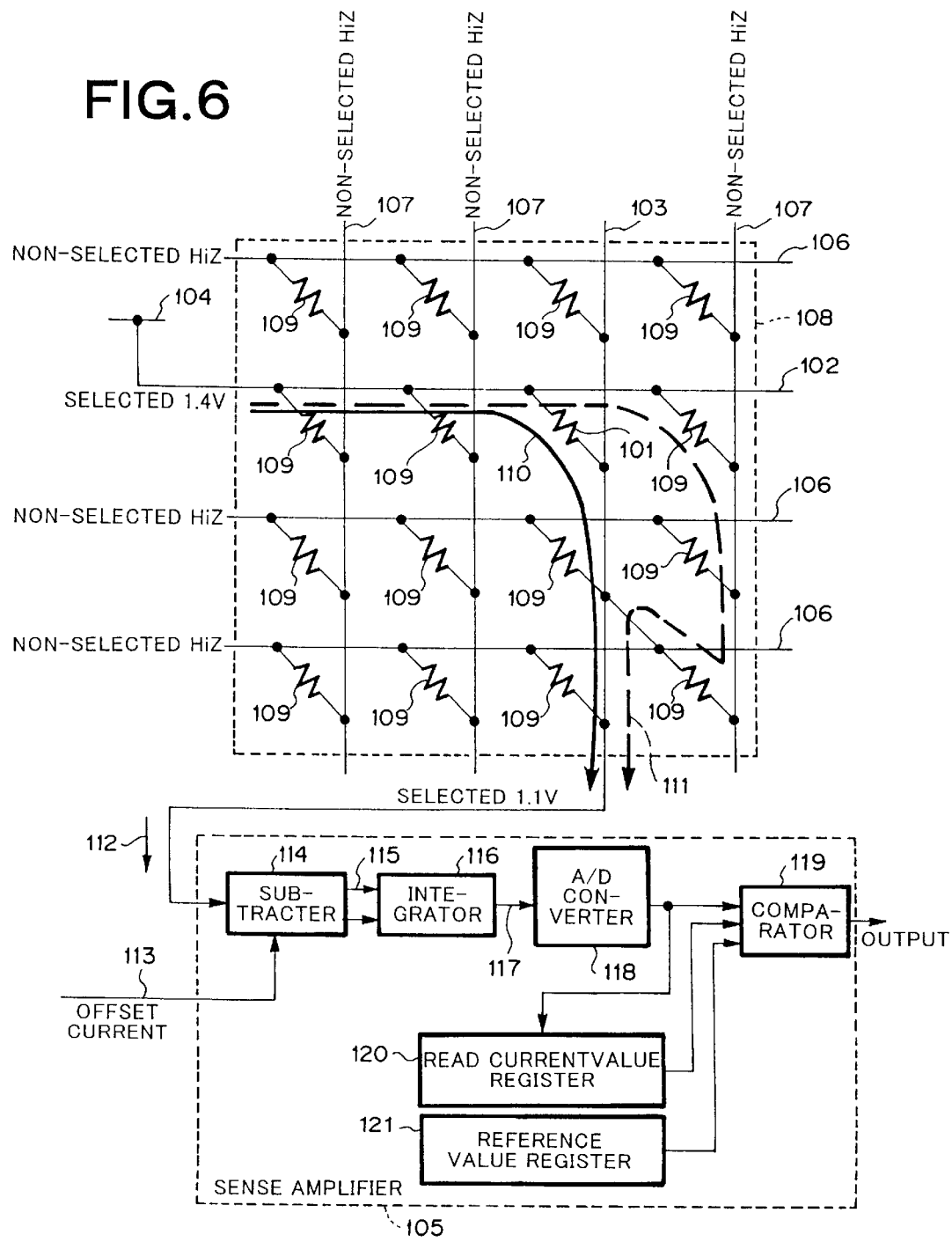
FIG. 6 is a schematic diagram showing principal portions of an MRAM according to an embodiment of the present invention.

FIG. 6 is a schematic diagram showing the concept of an MRAM according to an embodiment of the present invention. FIG. 6 shows only one cell array and one sense amplifier. According to the embodiment of the present invention, a selected word line 102 connected to a selected cell 101 is connected to a read power source 104. A selected bit line 103 connected to the selected cell 101 is connected to an input of a sense amplifier 105. The voltage of the selected bit line is determined by an input circuit of the sense amplifier 105. In the example shown in FIG. 6, the voltage of the read power source 104 is 1.4 V, whereas the input voltage of the sense amplifier is 1.1 V. Thus, their voltages are different. Because switches connected to non-selected word lines 106 other than the selected word line 102 and switches connected to non-selected bit lines 107 other than the selected bit line 103 are caused to be in a high impedance state, the non-selected word lines 106 and the non-selected bit lines 107 come in a floating state.

As a result, the non-selected word lines 106 and the non-selected bit lines 107 are not directly connected to the outside of the cell array 108. Noise does not enter the sense amplifier 105 from the outside through the non-selected word lines 106 and the non-selected bit lines 107, differently form the above-described related art references in which voltages are applied to the non-selected word lines 106 and the non-selected bit lines 107.

However, although the TMR element has a high resistance, it allows a current to flow therein. Thus, in addition to a current 110 that flows in the selected cell 101, a current that flows in each of non-selected cells 109 (for example, a current denoted by reference numeral 111) also flow in the sense amplifier 105. However, since an approximate value of the total current that flows in the non-selected cells 109 is estimated, a subtracter 114 subtracts an offset current 113 equivalent to the total current that flows in the non-selected cells 109 from a current 112 that flows into the sense amplifier 105. The current 112 is for example 51 $\mu$A. The offset current is for example 50 $\mu$A.

A current 115 after the subtraction is weak (for example, 1 $\mu$A). Thus, the current 115 is not directly read. Instead, the current 115 is integrated by an integrator 116. A signal 117 that represents the integrated charge is detected. As the integrator 116, a capacitor device is used. However, since the offset current 113 has been subtracted from the current 112 in the subtracter 114, the capacitance of the capacitor device can be decreased. In addition, it is not necessary to provide each of an A/D converter 118, a comparator 119, a read current value register 120, and a reference value register 121 of the sense amplifier 105 with unnecessary high order bits. Thus, most of the dynamic range of each of the A/D converter 118, the comparator 119, the read current value register 120, and the reference value register 121 can be assigned to the dynamic range of a signal component. Thus, the detected SIN ratio is increased.

Since the current measured by the sense amplifier 105 tends to be affected by fluctuation of the characteristic of the memory cell, according to the embodiment of the present invention, the value that has been subtracted, integrated, and A/D converted is temporarily stored in the read current value register 120. Next, "0" is written to the selected cell.

Thereafter, the value that has been subtracted, integrated, and A/D converted is read as the first time. The comparator 119 compares the value that had been read for the first time with the value that has been read for the second time. When the difference between the value that had been read for first time and the value that has been read for second time exceeds a predetermined error range, the value that had been written to the memory cell is "1". When the difference does not exceed the predetermined error range, the value that had been written to the memory cell is "0". The size of the error range has been stored in the reference value register 121. This method is referred to as self-reference reading method. Thus, in this method, the fluctuation of the characteristic of the memory cell can be prevented from affecting the determination as to whether the value written to the memory cell is "1" or "0".

Figure 7:
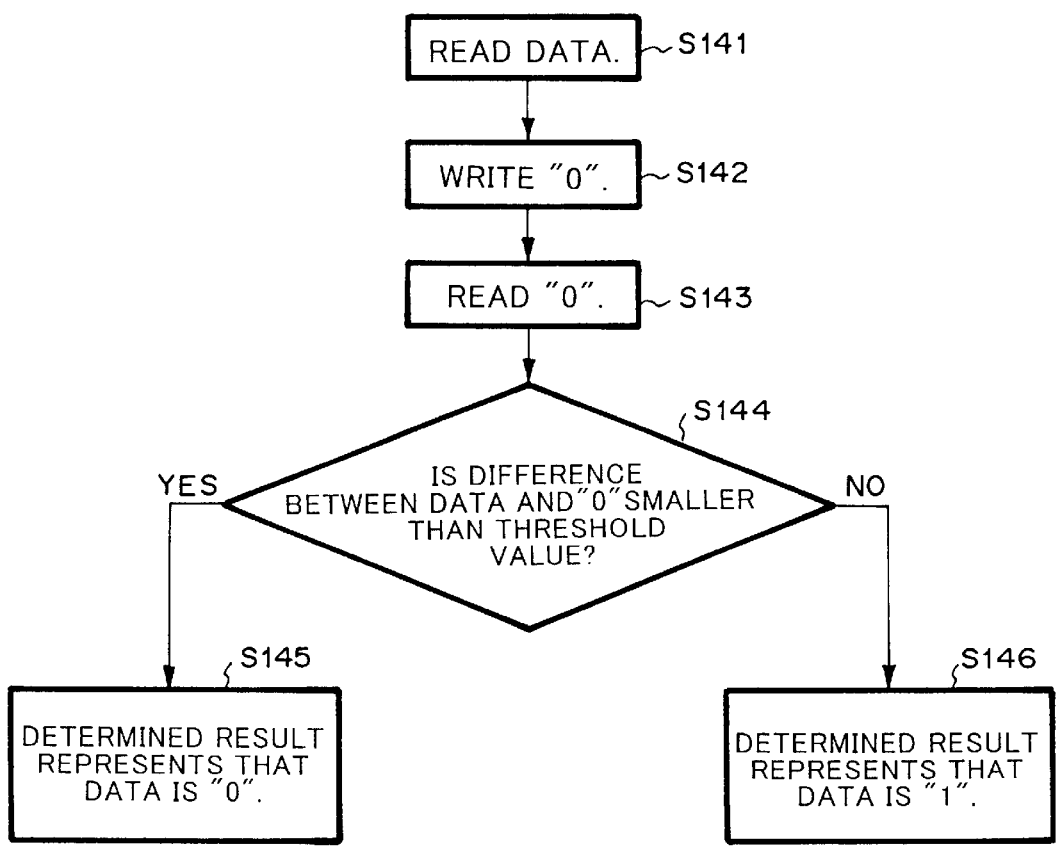
FIG. 7 is a flow chart showing an algorithm of a self-reference reading method.

Next, with reference to FIG. 7, an algorithm of the self-reference reading method will be described.

First of all, data is read (at step S141). Thereafter, "0" is written (at step S142). Next, "0" is read (at step S143). Next, it is determined whether or not the difference between the data and "0" is less than a predetermined threshold value (at step S144). When the difference is less than the threshold value, the determined result represents that the data is "0" (at step S145). Otherwise, the determined result represents that the data is "1" (at step S146).

Figure 8:
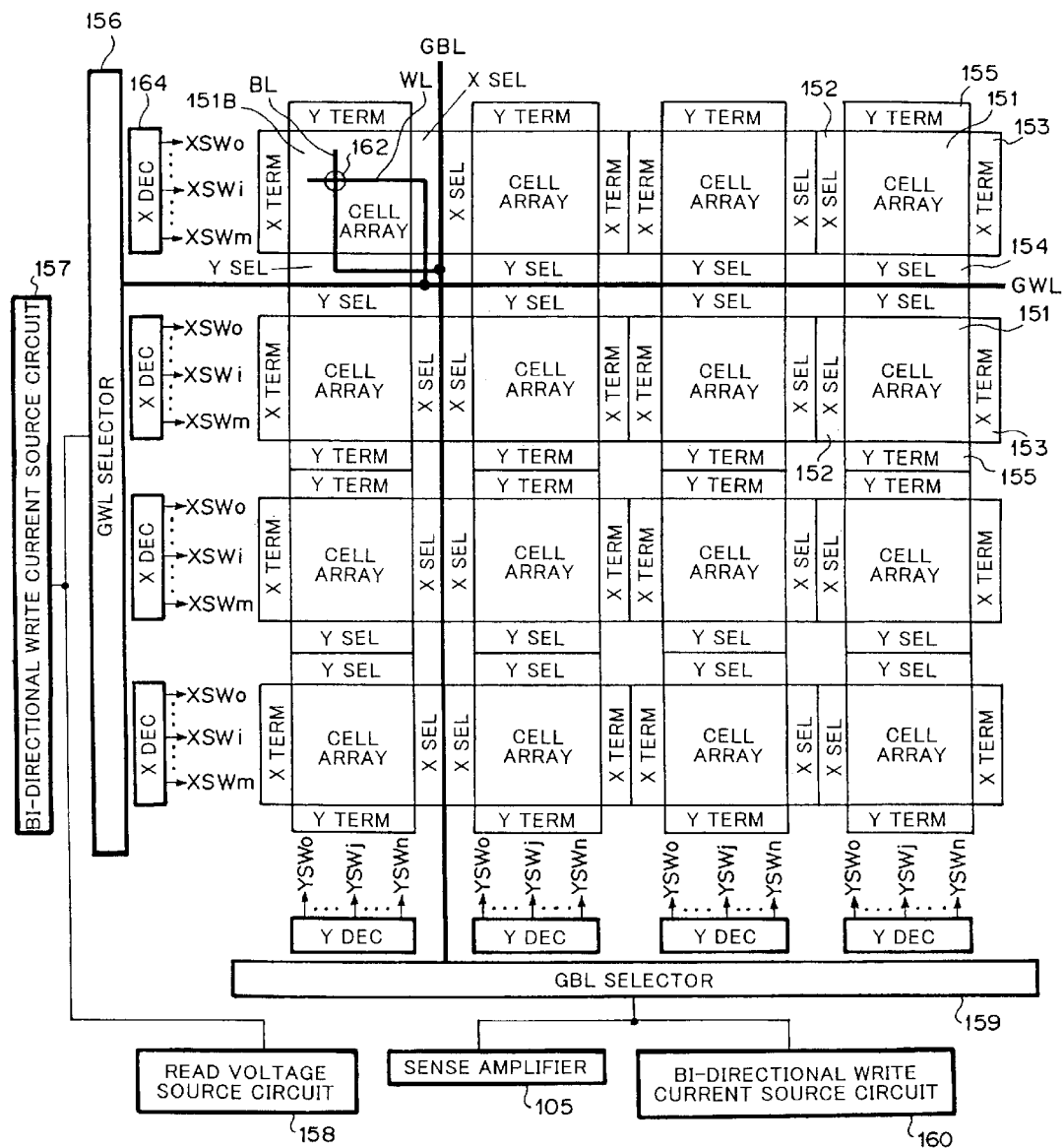
FIG. 8 is a schematic diagram showing the concept of the MRAM according to the embodiment of the present invention.

Next, with reference to a layout diagram as shown in FIG. 8, the MRAM according to the embodiment of the present invention will be described.

Referring to FIG. 8, the MRAM is composed of a plurality of cell arrays 151 arranged in a matrix shape. An X selector 152, an X termination circuit 153, a Y selector 154, and a Y termination circuit 155 are connected to each cell array 151. A GWL (Global Word Line) selector 156, a bi-directional write current source circuit 157, a read voltage source circuit 158, a GBL (Global Bit Line) selector 159, a bi-directional write current source circuit 160, and a sense amplifier 105 are connected in common with all the cell arrays 151 of the MRAM.

When data is to be written, a word line WL connected to a cell 162 to which the data is to be written is selected by an X selector 152 (hereinafter, a cell to which data is to be written is referred to as "a write cell" and a word line WL connected to the write cell is referred to as "a write word line"). A global word line GWL connected to a cell array 151B that contains the write cell 162 is selected by the GWL selector 156 (hereinafter, a cell array that contains a write cell is referred to as "a write cell array"). The GWL selector 156 is connected to a bi-directional write current source circuit 157. In addition, the write word line WL is connected to the X termination circuit 153. As a result, a current that flows between the bi-directional write current source circuit 157 and the X termination circuit 153 flows in the write word line WL.

In addition, when data is to be written, a bit line BL connected to the write cell is selected by the Y selector 154 (hereinafter, a bit line connected to the write cell is referred to as "a write bit line"). A global bit line GBL connected to the write cell array 151B is selected by the GBL selector 159. As a result, the GBL selector 159 is connected to the bi-directional write current source circuit 160. In addition, the write bit line BL is connected to the Y termination circuit 155. Thus, a current that flows between the bi-directional write current source circuit 160 and the Y termination circuit 155 flows in the write bit line BL.

Thus, data is written to the write cell 162 by a combined magnetic field composed of a magnetic field generated by a current that flows in the write word line WL and a magnetic field generated by a current that flows in the write bit line BL.

The details of the writing operation will be described later.

When data is to be read, a word line WL connected to a cell from which the data is to be read is selected by an X selector 152 (hereinafter a cell from which data is to be read is referred to as "a read cell" and a word line connected to the read cell is referred to as "a read word line"). A global word line GWL connected to a cell array 51B that contains the read cell 162 is selected by the GWL selector 156 (hereinafter, a cell array that contains a read cell is referred to as "a read cell array"). As a result, the GWL selector 156 is connected to the read voltage source circuit 158. In addition, the read word line WL is disconnected from an X termination circuit 153.

In addition, when data is to be read, a bit line BL connected to the read cell is selected by a Y selector 154 (hereinafter, a bit line connected to a read cell is referred to as "a read bit line"). A global bit line GBL connected to the read cell array 151B is selected by the GBL selector 159. As a result, the GBL selector 159 is connected to the sense amplifier 105. In addition, the read bit line BL is disconnected from a Y termination circuit 155.

In addition, word lines that are contained in the read cell array except for the read word line are caused to be in a floating state. Likewise, bit lines that are contained in the read cell array except for the read bit line are caused to be in a floating state.

Thus, by detecting a current that flows between the read voltage source circuit 158 and the sense amplifier 105 through the GWL selector 156, the global word line GWL, the X selector 152, the read word line WL, the read cell 162, the read bit line BL, the Y selector 154, the global bit line GBL, and the GBL selector 159, data is read.

In FIG. 8, the read word line WL and read bit line BL that break in the middle represent that when data is read, the read word line WL and the read bit line BL are disconnected from the X termination circuit 153 and the Y termination circuit 155, respectively. In order to represent that a current flows between the X selector 152 and the X termination circuit 153 through the word line WL and that a current flows between the Y selector 154 and the Y termination circuit 155 through the write bit line BL, the write word line WL and the write bit line BL should penetrate the cell array 151B. However, they are omitted for the simplicity of the drawing.

As is from the above description, bit lines and word lines are hierarchically disposed. In addition, since a single read voltage source circuit 158 and a single sense amplifier 105 are required, the area of the MRAM can be decreased.

Differently from the related art references, when data is read, noise does not affect the detected current through non-selected word lines or non-selected bit lines. Thus, by disposing the read voltage source circuit 158 adjacent to the sense amplifier 105, providing a bypass capacitor between a ground line of the read voltage source circuit 158 and a ground line of the sense amplifier 105, and providing a bypass capacitor between a power line of the read voltage source circuit 158 and a power line of the sense amplifier 105, noise that enters the power line and noise that enters the ground line become common between the read voltage source circuit 158 and the sense amplifier 105. Thus, the SIN ratio of the detected current can be prevented from deteriorating against the noise of the power source.

When data is read, it is necessary for a read cell array to satisfy connecting conditions in which a read word line is connected to a voltage source circuit, a read bit line is connected to a sense amplifier, word lines that are contained in the read cell array except for the read word line are caused to be in a floating state, and bit lines that are contained in the read cell array except for the read bit line are caused to be in a floating state.

Likewise, when data is read, it is necessary for a cell array that is selected from cell arrays other than the read cell array and that is used for generating an offset current (hereinafter, this cell array is referred to as "a reference cell array") to satisfy connecting conditions in which one word line (hereinafter, referred to as "a reference word line") contained in the reference cell array is connected to a voltage source circuit, one bit line (hereinafter, referred to as "a reference bit line") contained in the reference cell array is connected to the sense amplifier, word lines that are contained in the reference cell array except for the reference word line are caused to be in a floating state, and bit lines that are contained in the reference cell array except for the reference bit line are caused to be in a floating state. The use of the reference cell in order to generate the offset current will be explained later.

As long as the above two connecting conditions are satisfied, it is preferred to pre-charge as many word lines and bit lines at a third voltage as possible so as to quickly stabilize the current 112 that flows to the sense amplifier and the offset current 113 to converged values. The third voltage will be described later.

To stabilize those currents to the converged values, the X termination circuits 153 and the Y termination circuits 155 function as voltage source circuits. When data is written, all word lines (including a write word line) of all the cell arrays are connected to the respective X termination circuits 153. The voltages of all the word lines of all the cell arrays are set to the third voltage by the respective X termination circuits 153. In addition, when data is written, all bit lines (including a write bit line) of all the cell arrays are connected to the respective Y termination circuits 155. The voltages of all the bit lines of all the cell arrays are set to the third voltage by the respective Y termination circuits 155.

In addition, to stabilize those currents, when data is read, all word lines of all the cell arrays excluding both a read cell array and a reference cell array are connected to the respective X termination circuits 153. The voltages of all the cell arrays excluding both the read cell array and the reference cell array are set to the third voltage by the respective X termination circuit 153. In addition, when data is read, all bit lines of all the cell arrays excluding both the read cell array and the reference cell array are connected to the respective Y termination circuits 155. The voltages of all the bit lines of all the cell arrays excluding both the read cell array and the reference cell array are set to the third voltage by the respective Y termination circuit 155.

Figure 9:
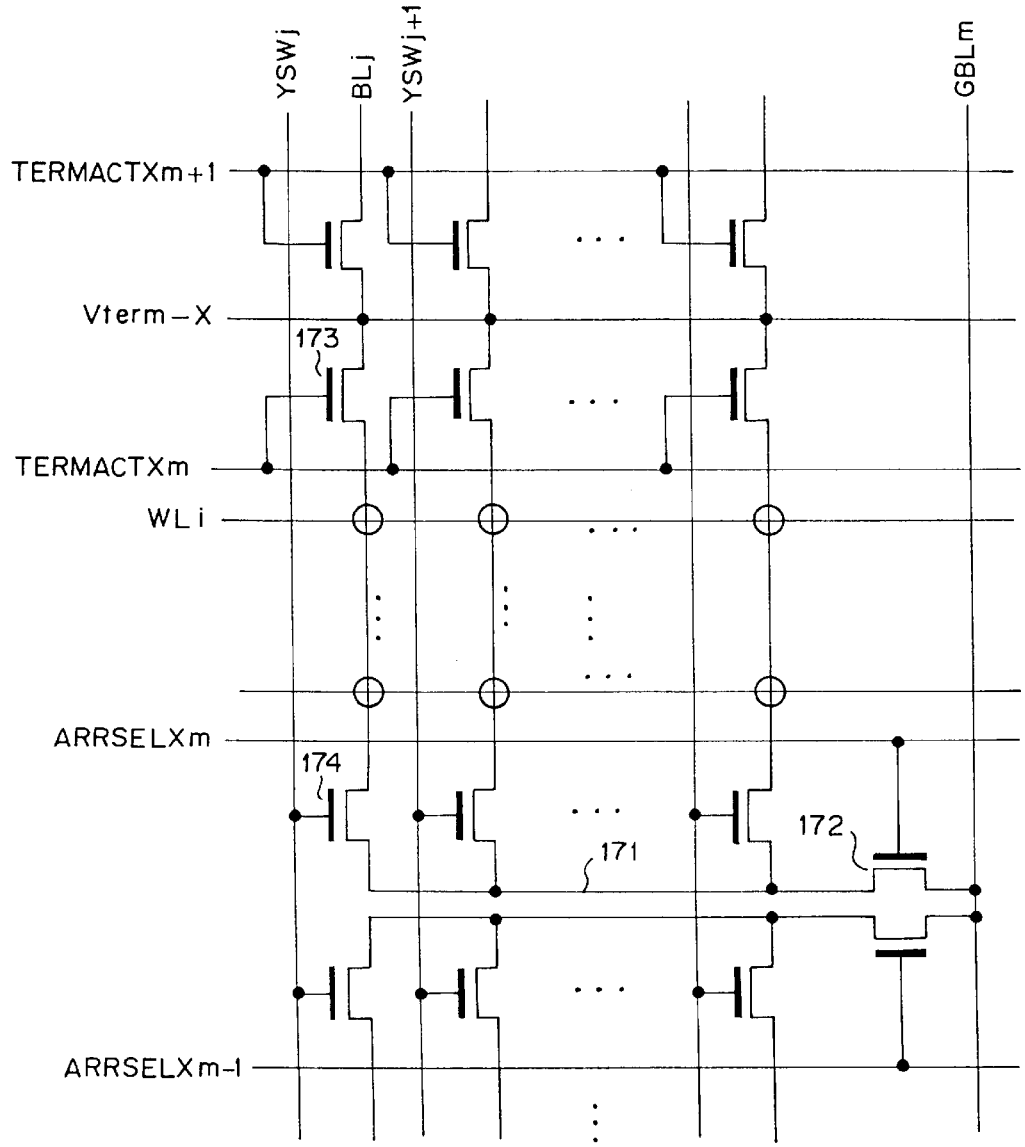
FIG. 9 is a circuit diagram showing bit lines and their peripheral circuits of the MRAM according to the embodiment of the present invention.

FIG. 9 is a circuit diagram showing bit lines and their peripheral portions.

In FIG. 9, ARRSELXm represents an X direction cell array selection signal line; TERMACTXm represents an X direction termination activation signal line; Vterm-Y represents a termination voltage line; YSWj represents a bit selection signal line; GBLn represents a global bit line; WLi represents a word line; and BLj represents a bit line.

The X direction cell array selection signal line ARRSELXm is a signal line for selecting a selected cell array (that is a general term that represents a write cell array, a read cell array, or a reference cell array). The X direction cell array selection signal line ARRSELXm controls a switch 172 that connects the global bit line GBLn to a cell array common bit line 171. The termination voltage line Vterm-Y is connected to a Y termination circuit 155. The terminal voltage line Vterm-Y is held at the third voltage. The X direction termination activation signal line TERMACTXm is a signal line for controlling whether or not the voltage of the bit line BLj is set to the third voltage. The X direction termination activation signal line TERMACTXm controls a switch 173 that connects the termination voltage line Vterm-Y held at the third voltage and the bit line BLj. The bit selection signal line YSWj is a signal line for selecting a bit in the selected cell array. The bit selection signal line YSWj controls a switch 174 that connects the cell array common bit line 171 and the bit line BLj. The global bit line GBLn is a line that connects the selected bit line in the selected cell array to the bi-directional write current source circuit 160 or the sense amplifier 105.

Figure 10:
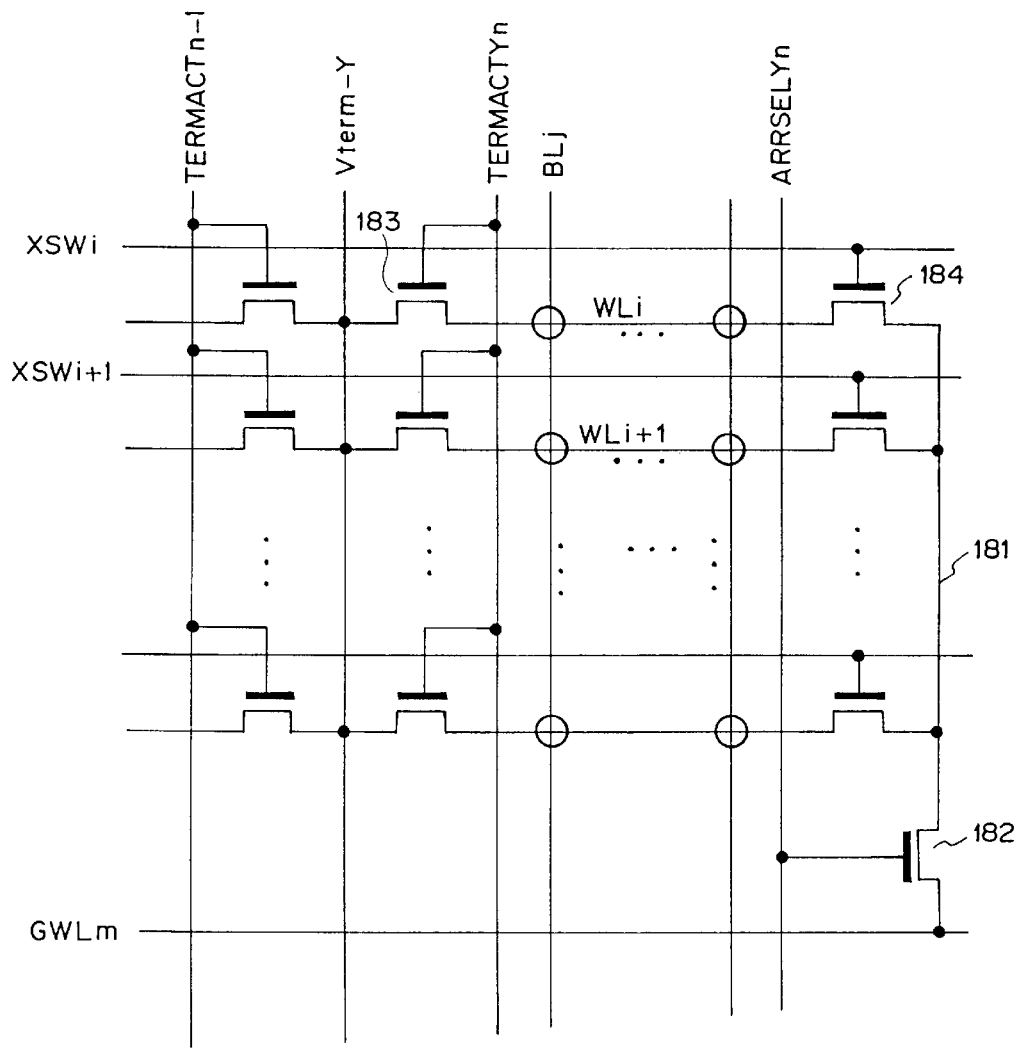
FIG. 10 is a circuit diagram showing word lines and their peripheral circuits of the MRAM according to the embodiment of the present invention.

FIG. 10 is a circuit diagram showing word lines and their peripheral portions.

In FIG. 10, ARRSELYn represents a Y direction cell array selection signal line; TERMACTYn represents a Y direction termination activation signal line; Vterm-X represents a termination voltage line; XSWi represents a word selection signal line; GWLm represents a global word line; WLi represents a word line; and BLj represents a bit line.

The Y direction cell array selection signal line ARRSELYn is a signal line for selecting a selected cell array. The Y direction cell array selection signal line ARRSELYn controls a switch 182 that connects the global word line GBLm and the cell array common word line 181. The termination voltage line Vterm-X is connected to an X termination circuit 153. The termination voltage line Vterm-X is held at the third voltage. The Y direction termination activation signal line TERMACTYn is a signal line for controlling whether or not the voltage of the word line WLi is set to the third voltage. The Y direction termination activation signal line TERMACTYn controls a switch 183 that connects the termination voltage line Vterm-X held at the third voltage and the word line WLi. The word selection signal line XSWi is a signal line for selecting a word in the selected cell array. The word selection signal line XSWi controls a switch 184 that connects the cell array common bit line 181 and the word line WLi. The global word line GWLm is a line that connects the selected word line of the selected cell array to the bi-directional write current source circuit 157 or the read voltage source circuit 158.

Next, with reference to a timing chart shown in FIG. 11, the reading operation will be described. Any switch shown in FIGS. 9 and 10 is an n-type FET of which a conduction state takes place when the gate voltage is high.

When data is read, the following signals with respect to the read cell array are set to the following levels. That is, the signal level of the X direction termination activation signal line TERMACTXm relating to the read cell array is low. The signal level of the Y direction termination activation signal line TERMACTYn relating to the read cell array is low. The signal level of the word selection signal line XSWi relating to the read word line is high. The signal level of the bit selection signal line YSWj relating to the read bit line is high. The signal level of the X direction cell array selection signal line ARRSELXm relating to the read cell array is high. The signal level of the Y direction cell array selection signal line ARRSELYn relating to the read cell array is high. Thus, the read word line and the read bit line are disconnected from the voltage source of the third voltage. The read word line is connected to the read voltage source circuit 158.

The read bit line is connected to the sense amplifier 105. At this point, as shown in FIG. 11, the voltage of the global word line GWL connected to the read cell array varies, for example, from 1.25 V (third voltage) to 1.45 V. The voltage of the read word line WL varies, for example, from 1.25 V (third voltage) to 1.40 V. The voltage of the read bit line BL varies, for example, from 1.25 V (third voltage) to 1.10 V. The voltage of the global bit line GBL connected to the read cell array varies, for example, from 1.25 V (third voltage) to 1.05 V. The difference between 1.45 V and 1.4 V results from the voltage drop due to the wiring resistance. Likewise, the difference between 1.10 V and 1.05 V results from the voltage drop due to the wiring resistance.

In addition, when data is read, the following signals with respect to the non-selected cell arrays are set to the following levels. That is, the signal level of the X direction termination activation signal line TERMACTXm relating to the non-selected cell arrays is high. The signal level of the Y direction termination activation signal line TERMACTYn relating to the non-selected cell arrays is high. The signal level of the word selection signal line XSWi relating to the non-selected word lines is low. The signal level of the bit selection signal line YSWj relating to the non-selected bit lines is low. The signal level of the X direction cell array selection signal line ARRSELXm relating to the non-selected cell arrays is low. The signal line of the Y direction cell array selection signal line ARRSELYn relating to the non-selected cell arrays is low. Thus, all the word lines and all the bit lines of all the non-selected cell arrays are connected to the voltage source of the third voltage and disconnected from the voltage source circuit 158 and the sense amplifier 105.

In addition, when data is read, the following signals with respect to the reference cell array are set to the following levels. That is, the signal level of the X direction termination activation signal line TERMACTXm relating to the reference cell array is low. The signal level of the Y direction termination activation signal line TERMACTYn relating to the reference cell array is low. The signal level of the word selection signal line XSWi relating to the reference word line is high. The signal line of the bit selection signal line YSWj relating to the reference bit line is high. The signal level of the X direction cell array selection signal line ARRSELXm relating to the reference cell array is high. The signal level of the Y direction cell array selection signal line ARRSELYn relating to the reference cell array is high. Thus, the reference word line and the reference bit line are disconnected from the voltage source of the third voltage. The reference word line is connected to the read voltage source circuit 158. The reference bit line is connected to a subtrahend side input of the subtracter 114 of the sense amplifier 105. At this point, the voltage of the global word line GWL connected to the reference cell array varies for example from 1.25 V (third voltage) to 1.45 V. The voltage of the reference word line WL varies for example from 1.25 V (third voltage) to 1.40 V. The voltage of the reference bit line BL varies for example from 1.25 V (third voltage) to 1.10 V. The voltage of the global bit line GBL connected to the reference cell array varies for example from 1.25 V (third voltage) to 1.05 V.

When data is read, a current that flows in the input of the sense amplifier contains not only a current that flows in the read cell, but a current that flows in each non-read cell. To secure the S/N ratio and prevent the total current from increasing, the size of the cell array cannot be increased. Thus, to improve the S/N ratio and decrease the current consumption, it is effective to divide the MRAM into a plurality of cell arrays and hierarchically dispose word lines and bit lines.

Since an overhead with respect to area in the hierarchical structure takes place in the selector circuits and the termination circuits, it is necessary to simplify the selector circuits and the termination circuits. According to this method, since two types of voltages are not applied to word lines and read lines, a selector circuit and a termination circuit for one line are composed of one transistor. Thus, according to the embodiment, the increase due to the overhead with respect to area in the hierarchical structure can be minimized.

Figure 12:
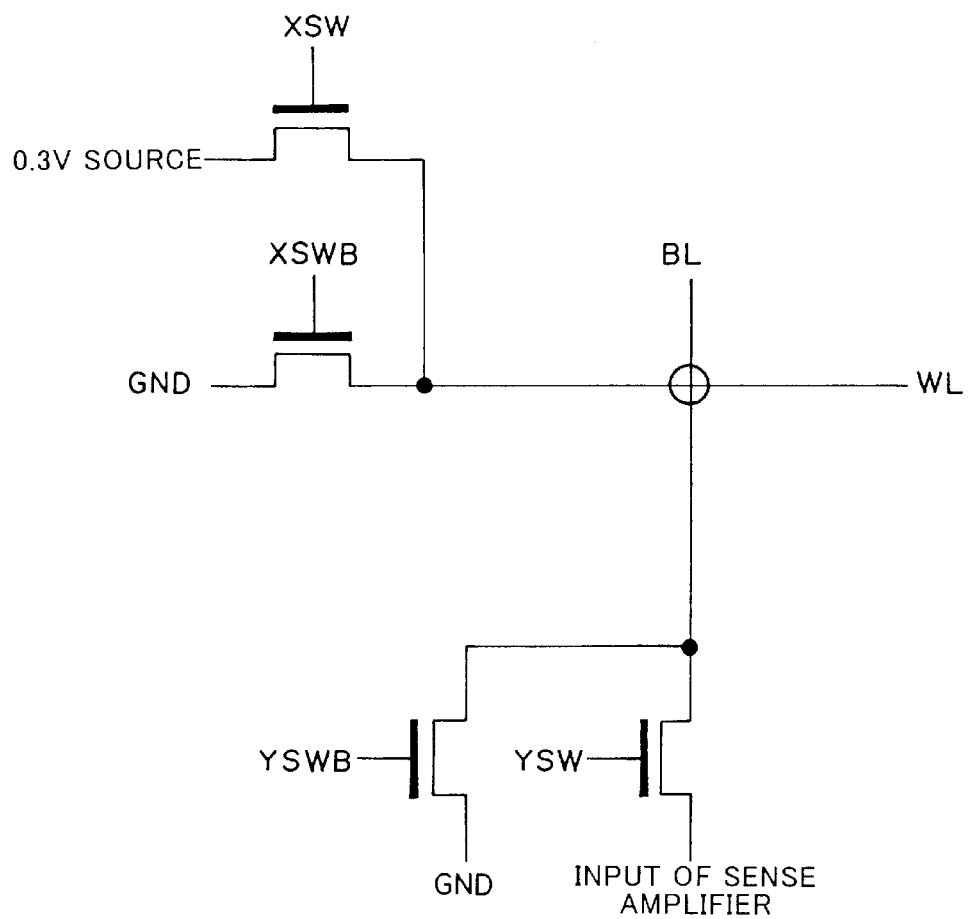
FIG. 12 is a circuit diagram showing a selector circuit according to the second related art reference.

As a reference, a selector circuit according to the second related art reference is shown in FIG. 12. In the selector circuit shown in FIG. 12, since respective predetermined voltages must be applied to not only the selected word line and the selected bit line, but also non-selected word lines and non-selected bit lines, one selector is composed of two transistors.

A signal XSW that is output from one X decoder is shared by cell arrays in the same row. In each non-selected array, even if the signal level of the signal XSW is high and one switch of the X selector is "on", all nodes of the cell array is held at a pre-charged voltage by the termination circuit. Thus, the levels of the word lines and the bit lines do not fluctuate. In addition, no current flows in the X selector.

Figure 13A:
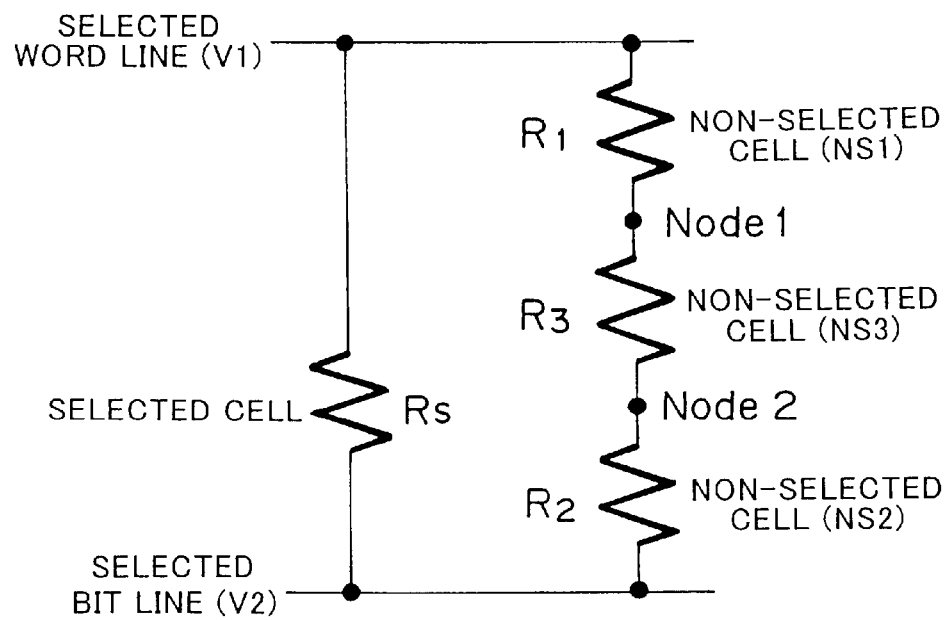
FIGS. 13A and 13B are circuit diagrams showing equivalent circuits of a cell array focused on currents that flow in the equivalent circuits assumed as two-terminal circuits of which respective terminals are connected to a selected word line and a selected bit line.

FIG. 13A shows an equivalent circuit of a cell array assumed as a two-terminal circuit of which respective terminals are connected to a selected word line and a selected bit line. In the equivalent circuit, focused on a current that flows in the cell array, the memory cell is treated as a resistor. The wiring resistance of word lines and bit lines is ignored.

Non-selected cells can be categorized into a group (NS1) consisting of non-selected cells connected to a selected word line, a group (NS2) consisting of cells connected to a selected bit line, and a group (NS3) consisting of cells connected to neither a selected word line nor a selected bit line.

When the resistance of a cell to which "1" has been written is denoted by R, the resistance of a cell to which "0" has been written is denoted by R+α, the number of word lines per cell array is denoted by m, and the number of bit lines per cell array is denoted by n, the following relations are satisfied.

$$Rs = R \text{ or } R + a$$

| | |
|---|---|
| $R1 = R/(n-1)$ | (minimum value) |
| $(R+a/2)/(n-1)$ | (average value) |
| $(R+a)/(n-1)$ | (maximum value) |
| $R2 = R/(m-1)$ | (minimum value) |
| $(R+a/2)/(m-1)$ | (average value) |
| $(R+a)/(m-1)$ | (maximum value) |
| $R3 = R/(m \times n - m - n + 1)$ | (minimum value) |
| $(R+a/2)/(m \times n - m - n + 1)$ | (average value) |
| $(R+a)/(m \times n - m - n + 1)$ | (maximum value) | where Rs represents the resistance of the selected cell; R1 represents the resistance of the group NS1; R2 represents the resistance of the group NS2; and R3 represents the resistance of the group NS3.

When non-selected cells are categorized as described above, the voltages of non-selected bit lines are distributed between the voltage of the node 1 and the voltage of the node 2 of the equivalent circuit. However, since the resistance R3 of the group NS3 is smaller than the resistance R1 of the group NS1 and the resistance R2 of the group NS2, the voltage between the node 1 and the node 2 is small.

Figure 13B:
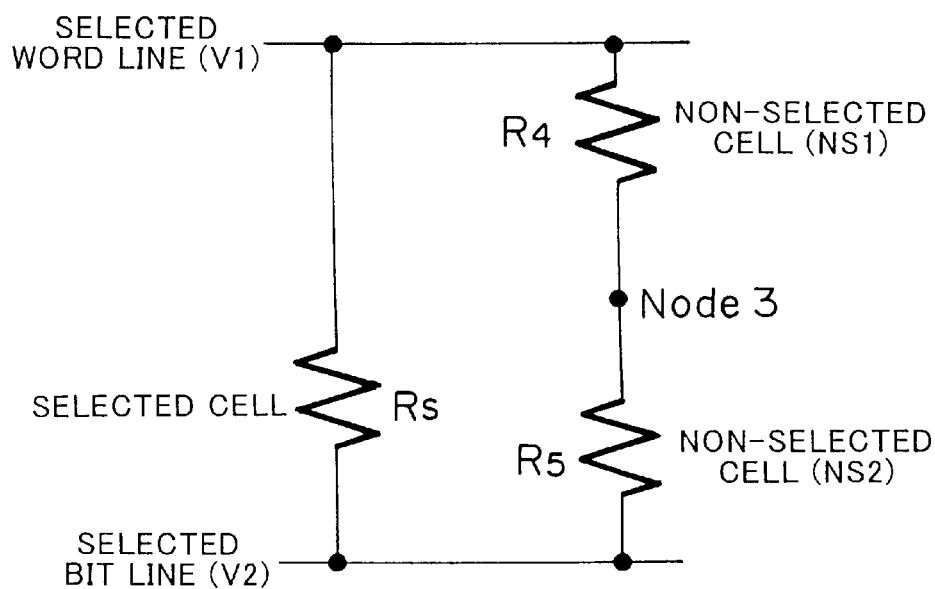

When the number m of word lines per cell array and the number n of bit lines per cell array are sufficiently large, the equivalent circuit shown in FIG. 13A can be approximated to an equivalent circuit shown in FIG. 13B. At this point, the voltage between the node 1 and the node 2 can be ignored. Thus, the node 1 and the node 2 become a common node node 3. When the resistance of the cell to which "1" has been written is denoted by R, the resistance of the cell to which "0" has been written is denoted by R+α, the number of word lines per cell array is denoted by m, and the number of bit lines per cell array is denoted by n, the following relations are satisfied.

$$Rs = R \text{ or } R + a$$

$$R4 = R/n \quad \text{(minimum value)}$$
$$\quad (R+a/2)/n \quad \text{(average value)}$$
$$\quad (R+a)/n \quad \text{(maximum value)}$$
$$R5 = R/m \quad \text{(minimum value)}$$
$$\quad (R+a/2)/m \quad \text{(average value)}$$
$$\quad (R+a)/m \quad \text{(maximum value)}$$

where Rs represents the resistance of the selected cell; R4 represents the resistance of the group NS1; and R5 represents the resistance of the group NS2.

At this point, the voltage V3 of the common node node 3 can be expressed as follows.

$$V3=(nV1+mV2)/(m+n)$$

Thus, the voltage of each of all the non-selected word lines and all the non-selected bit lines is equal to the voltage V3 of the node 3 of the equivalent circuit. When the relation of n=m is satisfied, the voltage V3 is the average voltage of V1 and V2.

When data is read, the voltage V1 is applied to the read word line of the read cell array. The voltage V2 is applied to the read bit line of the read cell array. After a sufficient time elapses, the voltage of each of all the non-selected word lines of the read cell array and each of all the non-selected bit lines of the read cell array becomes the voltage V3 of the node 3 of the equivalent circuit. However, because of stray capacitance connected in parallel with the resistor R4 and stray capacitance connected in parallel with the resistor R5, the voltage V3 of the node 3 of the equivalent circuit cannot be quickly reached. Likewise, when data is read, the voltage VI and the voltage V2 are applied to the reference word line and the reference bit line of the reference cell array, respectively. After a sufficient time elapses, the voltage of each of all the non-selected word lines and each of all the non-selected bit lines of the reference cell array becomes the voltage V3 of the node 3 of the equivalent circuit. However, likewise, because of stray capacitance connected in parallel with the resistor R4 and stray capacitance connected in parallel with the resistor R5, the voltage V3 of the node 3 of the equivalent circuit cannot be quickly reached.

Thus, when the voltage of each of all the bit lines and all the word lines of all the cell arrays excluding both the present read cell array and the present reference cell array is preset to the voltage V3, the voltage of the node 3 of the next read cell array and the voltage of the node 3 of the next reference cell array quickly become the voltage V3. The voltage V3 is the above-described third voltage.

When the voltage of each of all the bit lines and all the word lines of all the cell arrays excluding both the read cell array and the reference cell array is pre-set to the voltage V3, the current consumption can be prevented from excessively increasing. In addition, the probability that an excessive current causes data to be incorrectly written can be decreased.

In addition, since the voltage V3 is a write termination voltage, when the read mode changes to the write mode, no excessive current flows.

Figure 11:
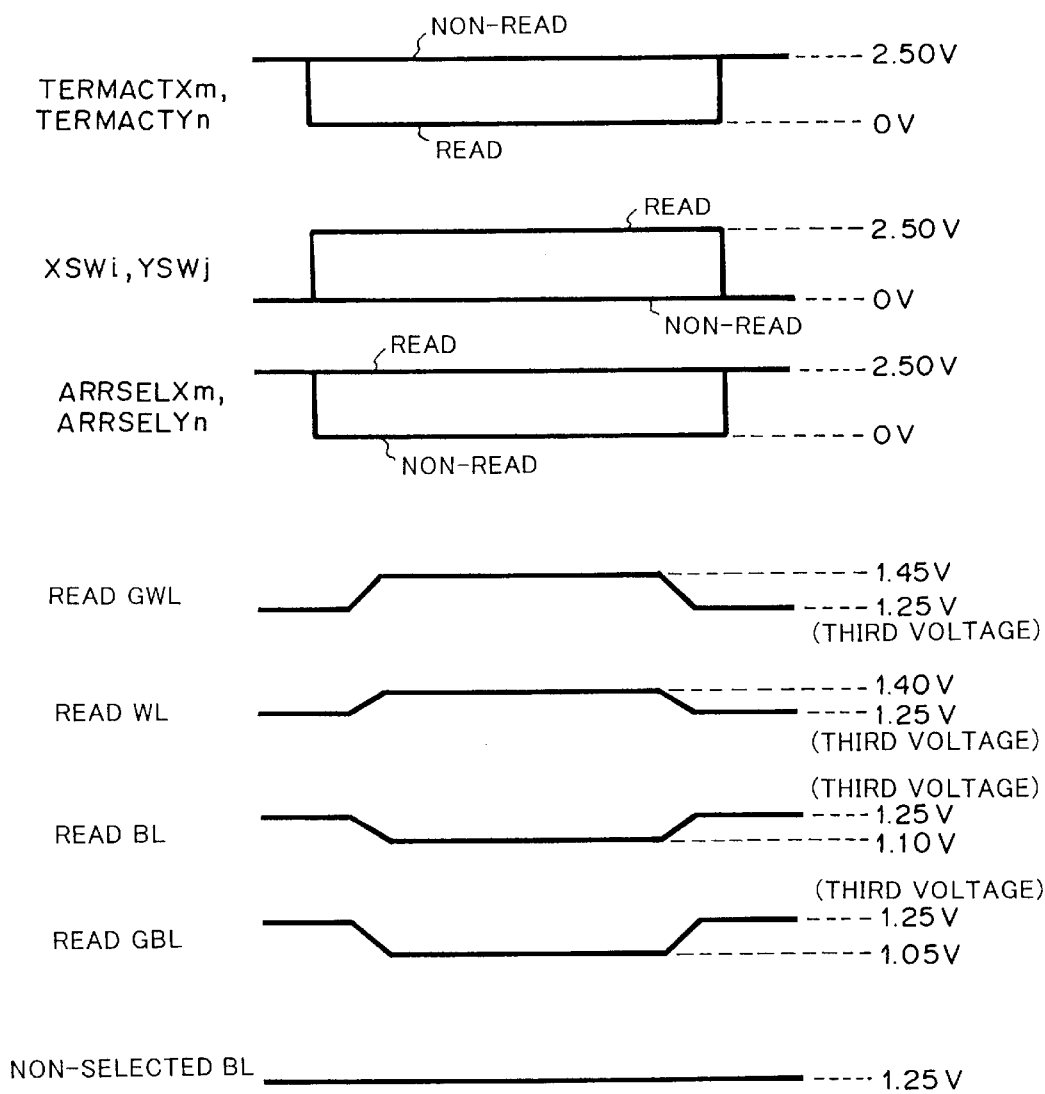
FIG. 11 is a timing chart showing a reading operation of the MRAM according to the embodiment of the present invention.

The voltages of the timing chart as shown in FIG. 11 apply to the case that the number m of word lines per cell array is equal to the number n of bit lines per cell array. The voltage V3 (=1.25 V) is the average voltage between the voltage V1 (=1.40 V) of the selected word line and the voltage (=1.10 V) of the selected bit line.

Figure 14:
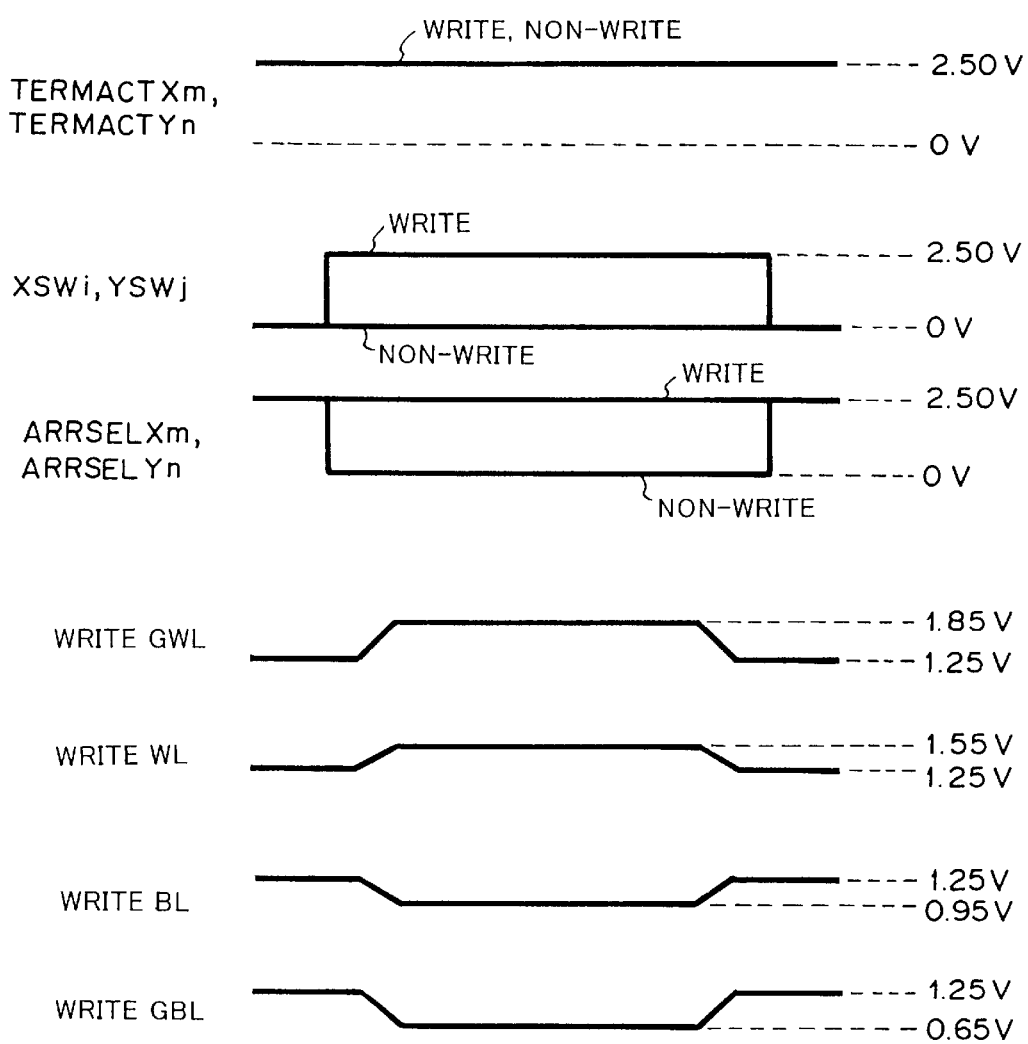
FIG. 14 is a timing chart showing a writing operation of the MRAM according to the embodiment of the present invention.

Next, the writing operation will be described with reference to a timing chart shown in FIG. 14.

When data is written, the following signals with respect to the write cell array are set to the following levels. That is, the signal level of the X direction termination activation signal line TERMACTXm relating to the write cell array is high. The signal level of the Y direction termination activation signal line TERMACTYn relating to the write cell array is high. The signal level of the word selection signal line XSWi relating the write word line is high. The signal level of the bit selection signal line YSWj relating the write bit line is high. The signal level of the X direction cell array selection signal line ARRSELXm relating to the write cell array is high. The signal level of the Y direction cell array selection signal line ARRSELYn relating to the write cell array is high. Thus, the write word line is connected to the voltage source of the third voltage and the bi-directional write current source circuit 157. The write bit line is connected to the voltage source of the third voltage and the bi-directional write current source circuit 160. Thus, the voltage of each of the write word line and the write bit line becomes the third voltage. A current flows in the write word line in the direction corresponding to the value of data to be written. Likewise, a current flows in the write bit line in the direction corresponding to the value of data to be written.

In addition, when data is written, the following signals with respect to the non-selected write cell arrays are set to the following levels. That is, the signal level of the X direction termination activation signal line TERMACTXm relating to the non-selected cell arrays is high. The signal level of the Y direction termination activation signal line TERMACTYn relating to the non-selected cell arrays is high. The signal level of the word selection signal line XSWi relating to the non-write word lines is low. The signal level of the bit selection signal line YSWj relating to the non-write bit lines is low. The signal level of the X direction cell array selection signal line ARRSELXm relating to the non-selected cell arrays is low. The signal level of the Y direction cell array selection signal line ARRSELYn relating to the non-selected cell arrays is low. Thus, all the word lines and all the bit lines of all the non-selected cell arrays and all the non-write word lines and non-write bit lines of the write cell array are connected to the voltage source of the third voltage and disconnected from the voltage source circuit 158 and the sense amplifier 105.

When data is written, although a large current flows in the X termination circuit and the Y termination circuit of the write cell array, since the X termination circuits and the Y termination circuits of the non-selected cell arrays are connected to the word lines and the bit lines of the non-selected cell arrays, stray capacitance of the word lines and the bit lines of the non-selected cell arrays functions as stabilizing capacitance that prevents the voltage of the voltage source from largely fluctuating. In other words, a dedicated stabilizing capacitance of the termination power circuits is not required.

Figure 15A:
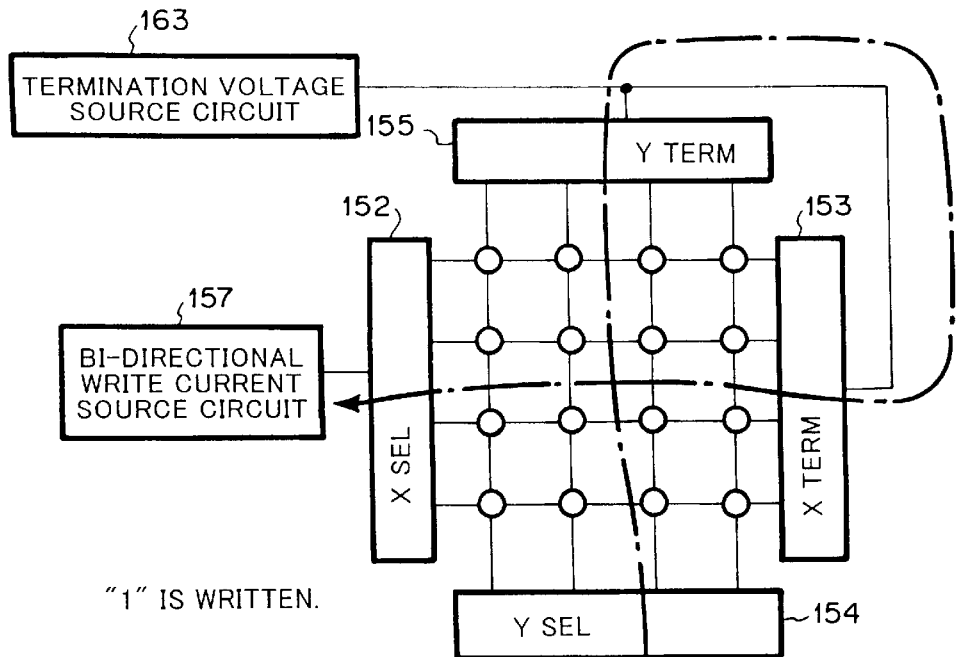
FIGS. 15A and 15B are schematic diagrams showing the directions in which a word line current and a bit line current flow when data is written in the MRAM according to the embodiment of the present invention.
Figure 15B:
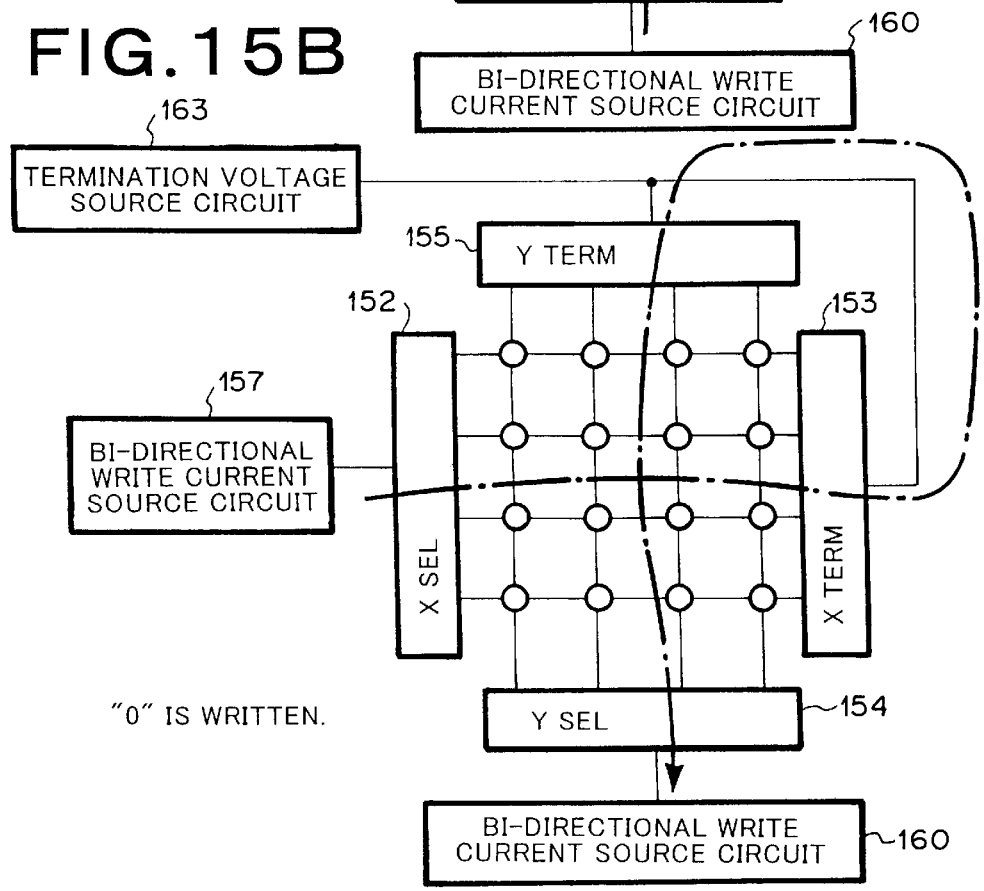

In addition, generally, as long as the direction of a current caused to flow to a write bit line changes depending on the value to be written, the direction of the current caused to flow to the write word line is arbitrary. However, according to the embodiment of the present invention, the direction of a current caused to flow to the write word line for which "1" is written is reverse to the direction of a current caused to flow to the write word line for which "0" is written. FIGS. 15A and 15B are schematic diagrams showing such a theory. As shown in FIG. 15A, when "1" is written, a current that flows from the write bit line to the Y termination circuit 155 flows to an X termination circuit 153 through a line that connects a Y termination circuit 155 and the X termination circuit 153 and then flows from the X termination circuit 153 to the write word line. Thus, the write current does not flow in a termination voltage source circuit 163. Likewise, as shown in FIG. 15B, when "0" is written, a current that flows from the write word line to the X termination circuit 153 flows to the Y termination circuit 155 through a line that connects the X termination circuit 153 and the Y termination circuit 155 and then flows from the Y termination circuit 155 to the write bit line. Thus, the write current does not flow in the termination voltage source circuit 163. Consequently, according to the embodiment of the present invention, the circuit scale of the termination voltage source circuit 163 is reduced. As a result, the current consumption is reduced.

Figure 16:
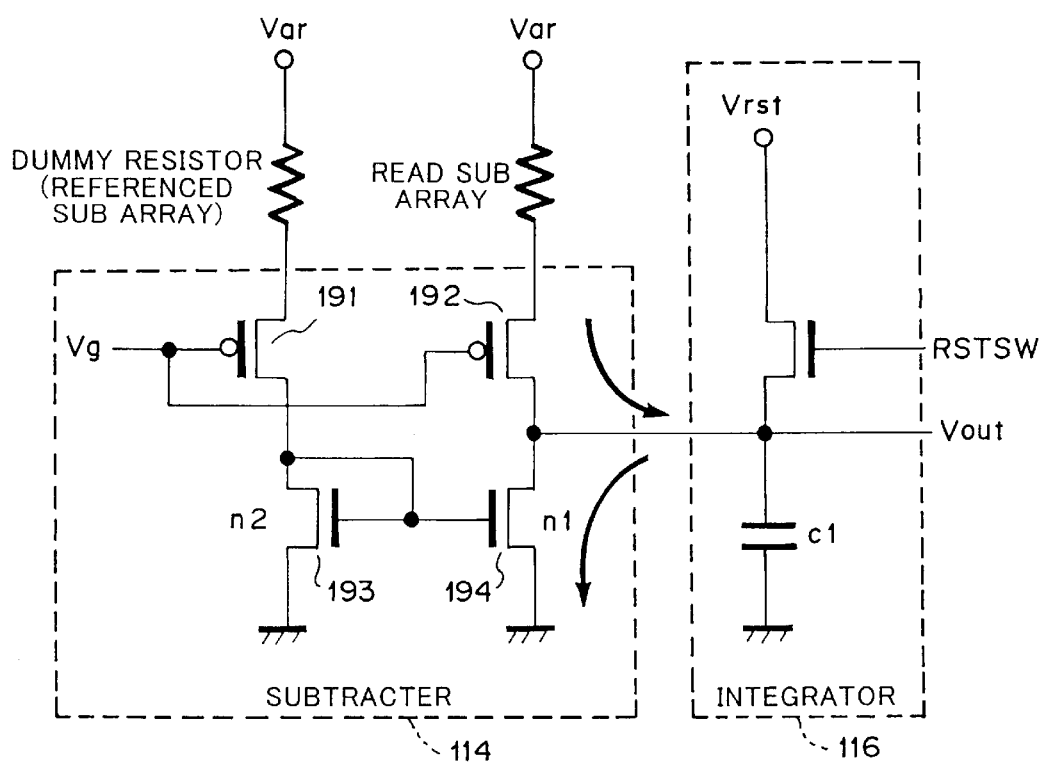
FIG. 16 is a circuit diagram showing an example of the structure of a subtracter and an integrator of a sense amplifier according to the embodiment of the present invention.

FIG. 16 shows a practical example of the subtracter 114 and the integrator 116 as shown in FIG. 6. In FIG. 16, Var represents the voltage of the read voltage source circuit 158 connected to the read word line of the read cell array and the reference word line of the reference cell array. The gate voltage Vg of a transistor 191 and a transistor 192 is set to around V2+Vth (threshold value) so that while the voltage of the read bit line of the read cell array and the voltage of the reference bit line of the reference cell array are held, the differential current flows between the subtracter 114 and the integrator 116. In the circuit, a dummy resistor that causes an offset current that is nearly the same as a current that flows in the read cell array is disposed. Using a current mirror composed of a transistor 193 and a transistor 194, an offset current that flows in the dummy resistor is subtracted from a current that flows in the read cell array. The differential current as the result of the subtraction flows between the subtracter 114 and the integrator 116. When the signal level of the signal RSTSW becomes high, Vout is reset to the reset voltage Vrst. When a current flows from the subtracter 114 to the integrator 116, the voltage Vout rises. In contrast, when a current flows from the integrator 116 to the subtracter 114, the voltage Vout lowers.

The dummy resistor may be composed of a variable resistor that allows the resistance to be varied with a fuse. However, since the characteristic of a real cell array largely fluctuates, a large circuit scale is required for a stable yield. Thus, according to the embodiment of the present invention, a reference cell array is used as a dummy resistor.

Figure 17:
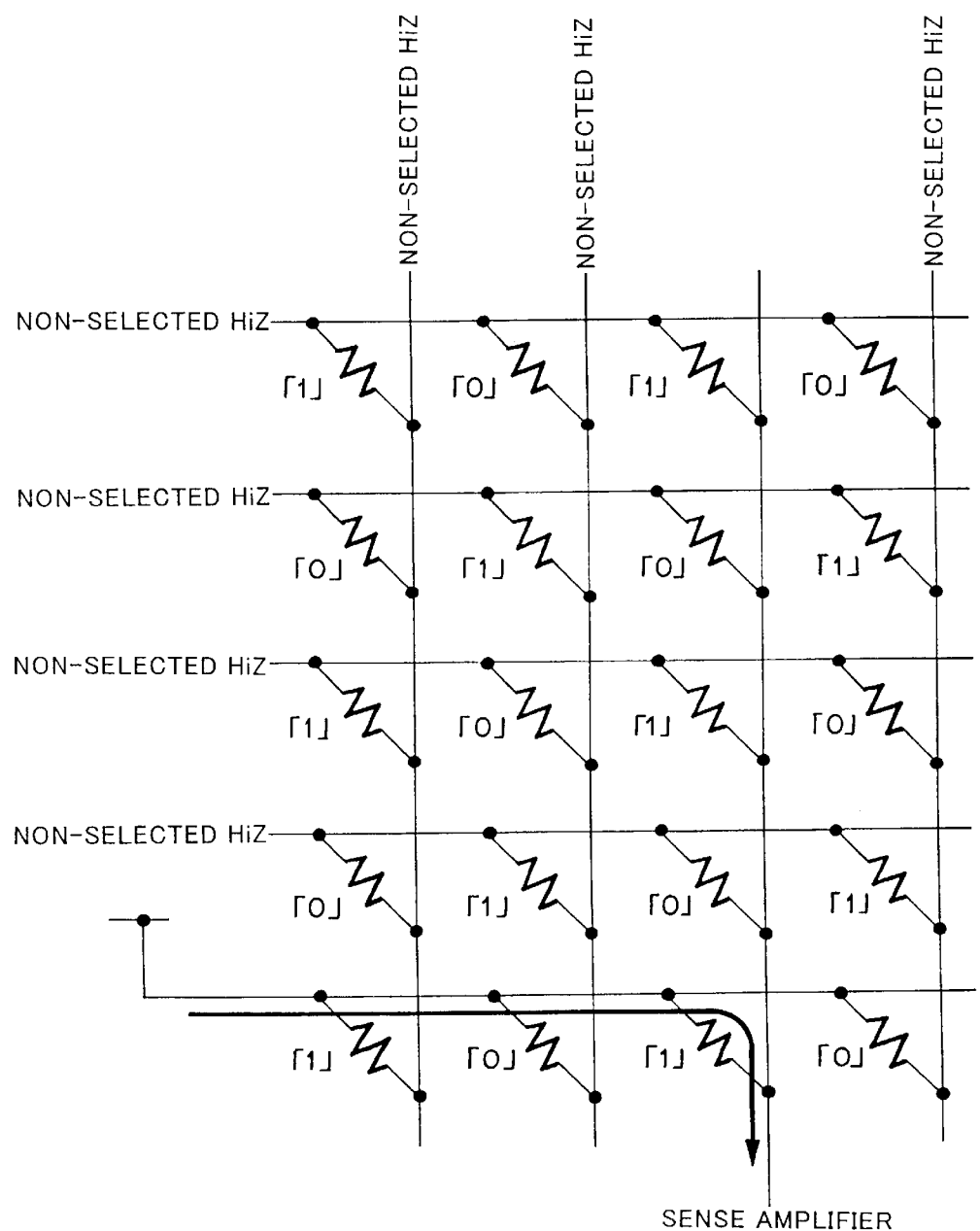
FIG. 17 is a circuit diagram showing a first example of the structure of a cell array dedicated for generating an offset current according to the embodiment of the present invention.

FIG. 17 shows a first example of the structure of a cell array dedicated for generating an offset current. In the first example, cells to which "1" has been written and cells to which "0" has been written are arranged in a checker pattern. When at least either the number of word lines or the number of bit lines is even, the number of cells to which "1" has been written is equal to the number of cells to which "0" has been written. When the number of word lines and the number of bit lines are both odd, the number of cells to which "1" has been written is different from the number of cells to which "0" has been written by 1.

Figure 18:
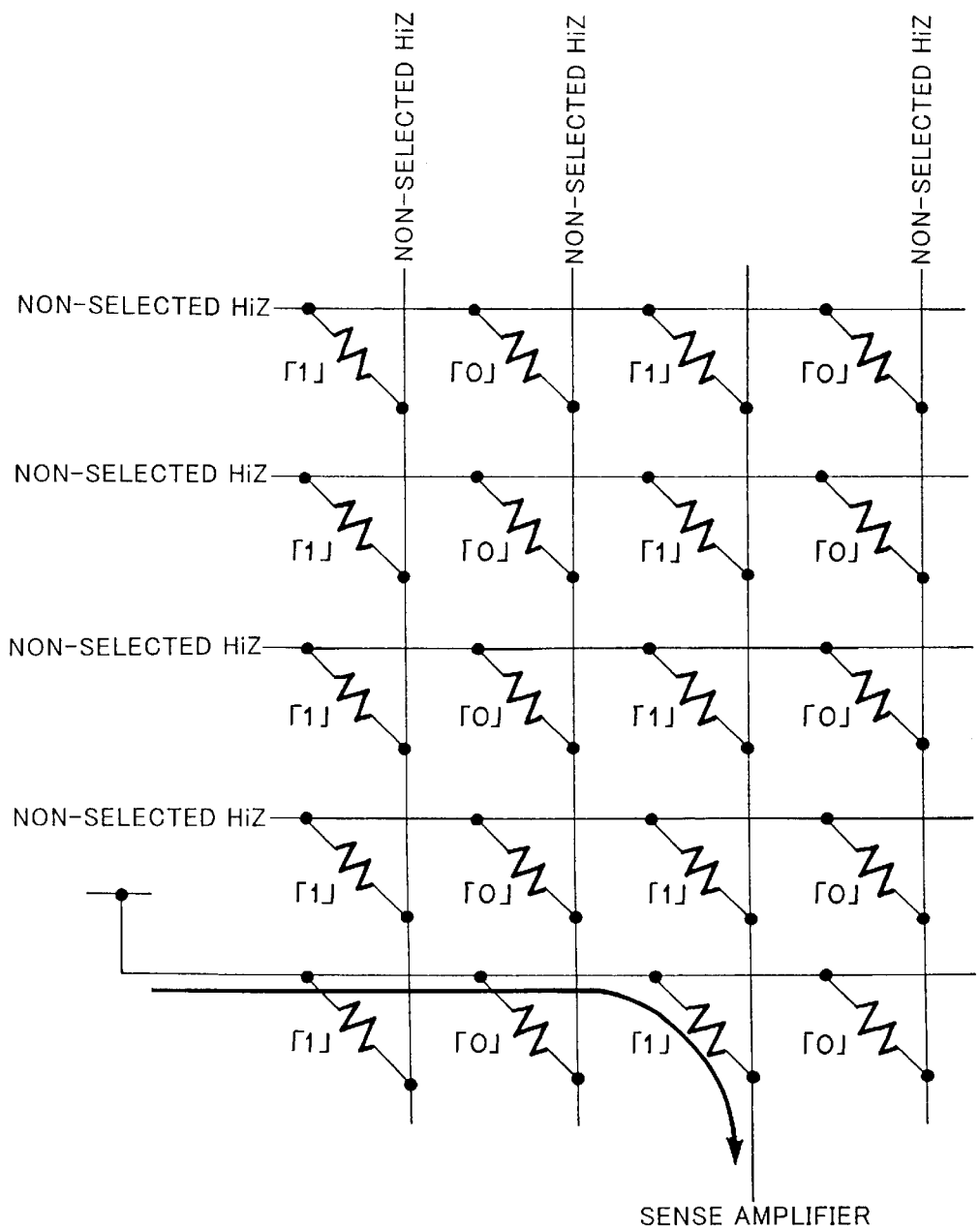
FIG. 18 is a circuit diagram showing a second example of the structure of a cell array dedicated for generating an offset current according to the embodiment of the present invention.

FIG. 18 shows a second example of the structure of a cell array dedicated for generating an offset current. In the second example, cells to which "1" has been written and cells to which "0" has been written are arranged in a stripe pattern. When the number of line pairs is an integer, the number of cells to which "1" has been written is equal to the number of cells to which "0" has been written. When the number of line pairs is not an integer, the number of cells to which "1" has been written is different from the number of cells to which "0" has been written by the number of cells along the stripe direction.

In the example shown in FIGS. 17 and 18, the cell at the point where the word line to which the voltage is applied and the bit line which is connected to the sense amplifier is regarded as a type of dummy cell.

In the examples shown in FIGS. 17 and 18, the following relations are nearly satisfied for the reference cell array of the equivalent circuit shown in FIG. 13A.

Figure 19:
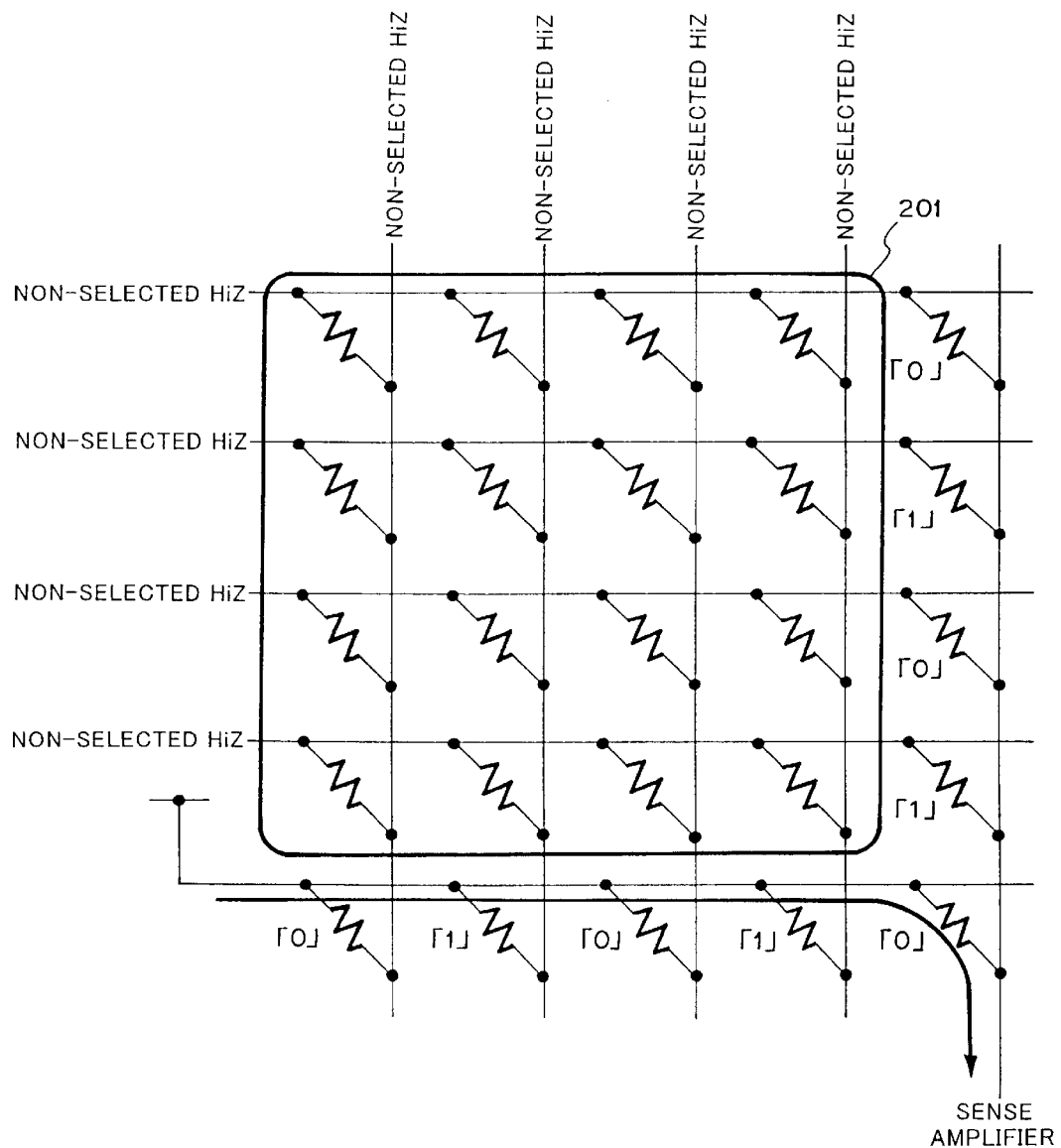
FIG. 19 is a circuit diagram showing a first example of the structure of a cell array having a valid data area with a function for generating an offset current according to the embodiment of the present invention.

$Rs = R$ or $R+\alpha$ $R1 = (R+\alpha/2)/(n-1)$ $R2 = (R+\alpha/2)/(m-1)$ $R3 = (R+\alpha/2)/(m \times n - m - n + 1)$ FIG. 19 shows an example of a cell array that becomes not only a write cell array, a read cell array, but also a reference cell array by extending a cell array containing a cell from and to which data is read and written. In FIG. 19, data is written to and read from cells in an area surrounded by a frame 201. Cells outside the frame 201 are dummy cells. A word line connected to a dummy cell is a dummy word line. Likewise, a bit line connected to a dummy cell is a dummy bit line. When the number of dummy cells connected to the dummy word line is even, the number of dummy cells that are connected to the dummy word line and to which "1" has been written is equal to the number of dummy cells that are connected to the dummy word line and to which "0" has been written. When the number of dummy cells connected to the dummy word line is odd, the number of dummy cells that are connected to the dummy word line and to which "1" has been written is different from the number of dummy cells that are connected to the dummy word line and to which "0" has been written by 1. Likewise, when the number of dummy cells connected to the dummy bit line is even, the number of dummy cells that are connected to the dummy word line and to which "1" has been written is equal to the number of dummy cells that are connected to the dummy word line and to which "0" has been written. When the number of dummy cells connected to the dummy bit line is odd, the number of dummy cells that are connected to the dummy word line and to which "1" has been written is different from the number of dummy cells that are connected to the dummy word line and to which "0" has been written by 1. In the example shown in FIG. 19, the following relations are nearly satisfied for the reference cell array of the equivalent circuit shown in FIG. 13A.

$Rs = R$ or $R+\alpha$ $R1 = (R+\alpha/2)/(n-1)$ $R2 = (R+\alpha/2)/(m-1)$

On the other hand, since cells of the group NS3 is cells in the area of the frame 201, the resistance R3 varies in the range from $R/(m \times n-m-n+1)$ to $(R+\alpha)/(m \times n-m-n+1)$. However, the resistance R3 is sufficiently smaller than the resistance R1 and the resistance R2. This tendency becomes strong as the size of the cell array becomes large. By the way, in the example shown in FIG. 19, it is not necessary to dispose a cell array dedicated for generating an offset current in the MRAM. Thus, the example of the structure shown in FIG. 19 may be used depending on the allowance of the fluctuation of the resistance R3 and the circuit scale of the MRAM.

Figure 20:
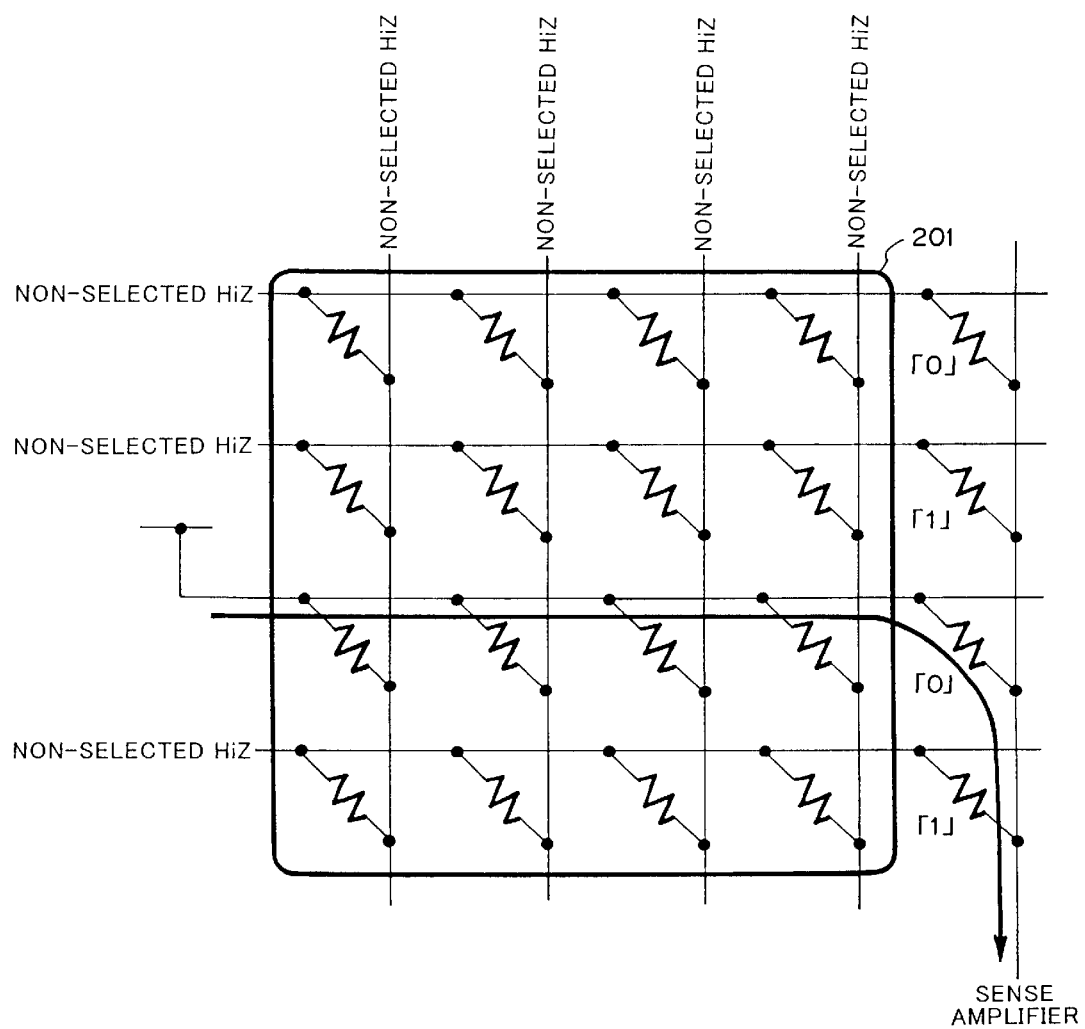
FIG. 20 is a circuit diagram showing a second example of the structure of a cell array having a valid data area with a function for generating an offset current according to the embodiment of the present invention.

FIG. 20 shows a cell array in which a dummy word line and dummy cells connected thereto are deleted from the cell array as shown in FIG. 19, as a first modification of the example shown in FIG. 19. To obtain an offset current using such a cell array, any one word line is connected to a voltage source of a first voltage. A dummy bit line is connected to the subtracter 114. Word lines that are contained in the cell array shown in FIG. 20 and that are not connected to the voltage source of the first voltage are caused to be in a floating state. In addition, bit lines that are contained in the cell array shown in FIG. 20 and that are not the dummy bit line are caused to be in a floating state. In this case, the resistance R1 of the group NS1 varies in the range from $R/(n-1)$ to $(R+\alpha)/(n-1)$. However, the resistance R2 of the group NS2 does not vary.

Figure 21:
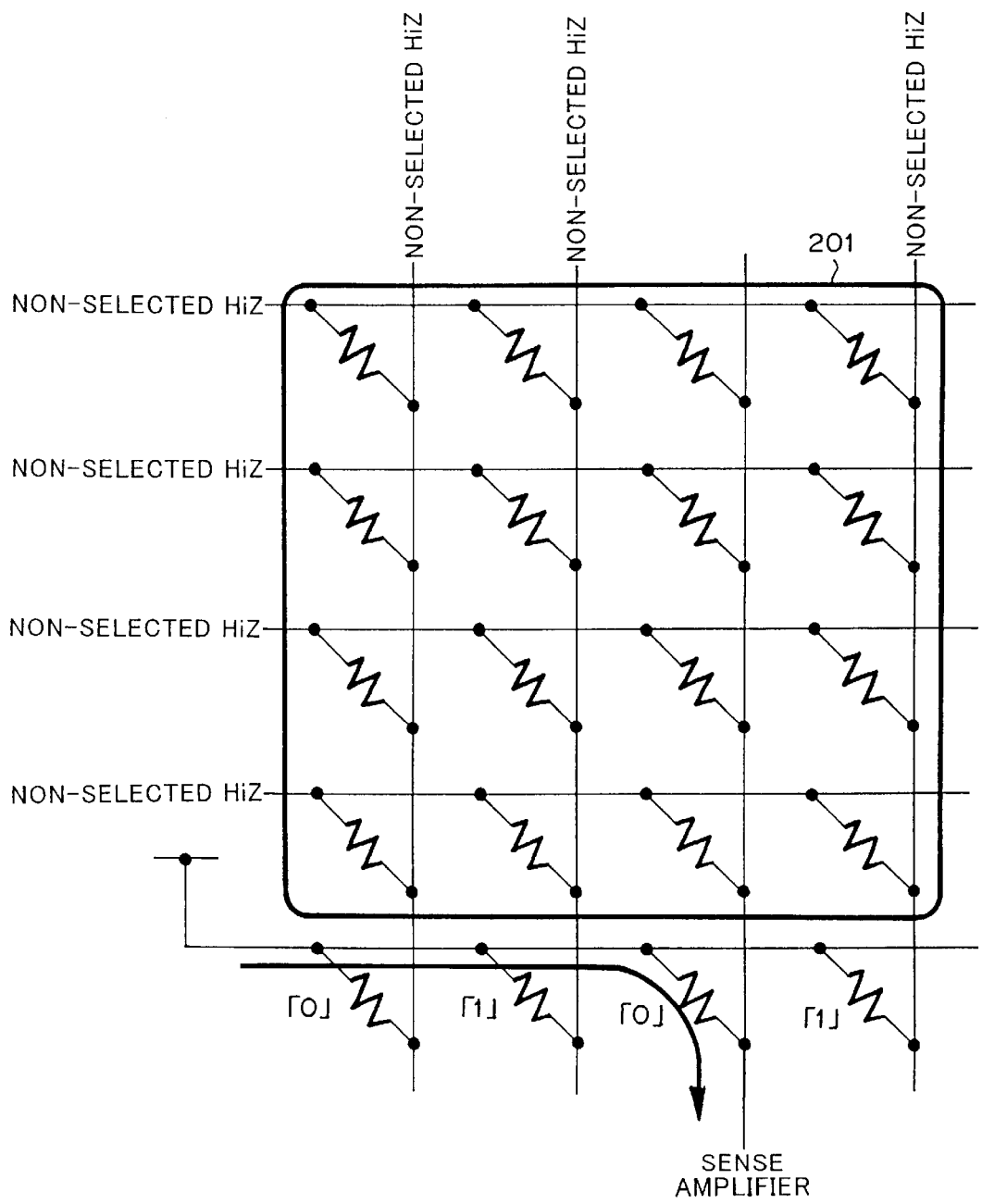
FIG. 21 is circuit diagram showing a third example of the structure of a cell array having a valid data area with a function for generating an offset current according to the embodiment of the present invention.

FIG. 21 shows a cell array in which a dummy bit line and dummy cells connected thereto are deleted from the cell array as shown in FIG. 19, as a second modification of the example shown in FIG. 19. To obtain an offset current using such a cell array, a dummy word line is connected to a voltage source of a first voltage. Any one bit line is connected to a subtracter 114. Word lines that are contained in the cell array shown in FIG. 21 and that are not connected to the subtracter 114 are caused to be in a floating state. Bit lines that are contained in the cell array shown in FIG. 21 and that are not connected to the subtracter 114 are caused to be in a floating state. In this case, although the resistance R2 of the group NS2 varies from $R/(m-1)$ to $(R+\alpha)/(m-1)$, the resistance R1 of the group NS1 does not vary.

In the examples shown in FIGS. 17, 18, 19, 20, and 21, because the offset current includes a current that flows through a cell at an intersection of the reference word line and the reference bit line of the reference cell array (the cell is equivalent to resistance Rs) in addition to a current that flow to the resistors R1, R2, and R3 in series, the offset current slightly varies. However, the object of the present invention to remarkably decrease the current that flows between the subtracter 114 and the integrator 116 is nevertheless accomplished. Thus, it is not necessary to dare to delete the cell at the intersection of the reference word line and the reference bit line of the reference cell array. In this case, a situation that the offset current is larger than the signal current may take place. However, when the integrator 116, the A/D converter 118, the comparator 119, and the read current value register 120 can deal with both the directions of the current 115, such a problem can be solved.

Figure 22:
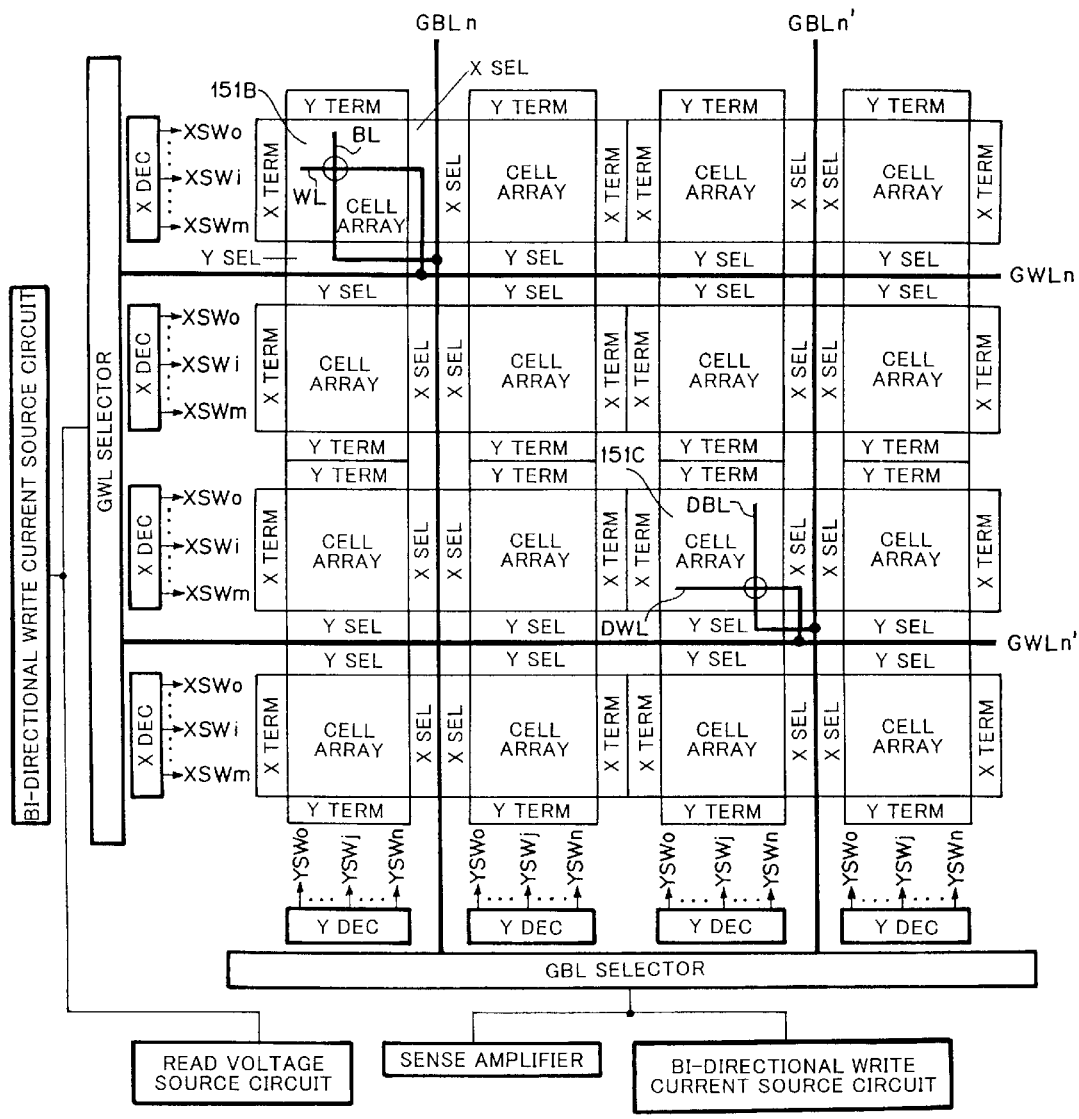
FIG. 22 is a schematic diagram showing an operation for reading a current composed of a signal current and an offset current from a read cell array and an offset current from a reference cell array in the MRAM according to the embodiment of the present invention.

FIG. 22 shows an operation in which a current composed of a signal current and an offset current is read from a read cell array 151B and an offset current is read from a reference cell array 151C. As shown in FIG. 22, the read cell array 151B is different from the reference cell array 151C. In addition, the read cell array 151B and the reference cell array 151C are arranged so that they do not overlap in both the X direction and the Y direction and so that they do not use the same global word line and the same global bit line.

For easy understanding, in FIGS. 8 and 22, X termination circuits and the X selectors are disposed at the ends of each cell array. However, according to the embodiment of the present invention, each cell array overlays on these circuits as shown in FIG. 23. This is because transistors are not connected to individual cells (TMR elements) as is apparent from a sectional view as shown in FIG. 24.

As was described above, according to the present invention, noise that enters a read current from the outside of a cell array becomes weak. Without need to disposed diodes, a signal can be sensed. In addition, the structure of a selector circuit can be simplified.

In addition, according to the present invention, since almost all the dynamic range of a sense amplifier is used for the dynamic range of a signal component, the probability that data is incorrectly detected due to random noise can be decreased. The sum of a current that flows in a selected cell and a current that flows in non-selected cells is around 51 $\mu$A, whereas a current that flows in the non-selected cells is around 50 $\mu$A. Therefore, when the offset current is removed, the signal to random noise ratio can be improved by 34 dB. In addition, since a current integrated by an integrator can be decreased, the area for the integrator can be decreased.

In addition, according to the present invention, since one sense amplifier is shared by a plurality of cell arrays, the number of sense amplifiers can be decreased, whereby the chip size can be decreased. In addition, since a current that flows in cells other than a selected cell can be decreased, the power consumption can be decreased. In addition, when cell arrays are redundantly disposed, the yield of the MRAM can be improved. In addition, since the wiring resistance can be decreased, the variation of the current can be decreased.

In addition, according to the present invention, since an offset current is generated by a second cell array that is produced in the same process as a first cell array. Therefore, an offset current generated in the second cell array for canceling a current that flows in non-selected cells in the first cell array can be varied corresponding to the variation of the current that flows in the non-selected cells in the first cell.

When a second cell array is a cell array to which valid data has been written, an offset current generated by the second cell array varies depending on the value of data. In contrast, according to on of aspects of the present invention, since an offset current is generated by a dedicated cell array that does not cause the value of data written in a cell to vary, the offset current does not vary. Thus, the accuracy of a signal current from which the offset current has been removed becomes high.

In addition, according to the present invention, since the offset current is an average current that flow in the non-selected cells, the accuracy of the center value of a signal current from which the offset current has been removed becomes high.

In addition, according to one of aspects of the present invention, since the MRAM need not have a dedicated cell array, the circuit scale of the MRAM can be decreased.

When any arbitrary word line and any arbitrary bit line of a second cell array are selected and a current that flows in the selected bit line is used as an offset current generated in the second cell array, the offset current varies depending on the value of data written to the second cell array.

In contrast, according to one of aspects of the present invention, since a current that flows in the dummy bit line when a dummy word line and the dummy bit line are selected is used as an offset current, the variation of the offset current depending on the value of data written in the second cell array can be remarkably decreased.

According to one of aspects of the present invention, a dummy word line and any arbitrary bit line of a second cell array are selected and a current that flows in the selected bit line is used as an offset current generated by the second cell array. Therefore, the variation of the offset current depending on the value of data written to the second cell array can be remarkably decreased.

According to one aspect of the present invention, any arbitrary word line and a dummy bit line of a second cell array are selected, and a current that flows in the dummy bit line is used as an offset current generated by the second cell array. Therefore, the variation of the offset current depending on the value of data written to the second cell array can be remarkably decreased.

In addition, according to the present invention, since random noise can be averaged by the integrator, the SIN ratio is improved, whereby a weak signal can be sensed.

In addition, according to the present invention, since self-reference reading method is used, the probability that a read error takes place can be remarkably decreased.

In addition, according to the present invention, since word lines and bit lines are pre-charged at an intermediate voltage, the sense start time of a sense amplifier circuit can be put forward. In addition, the probability that a current consumption due to an excessive current is increased and a write error takes place can be decreased.

In addition, according to the present invention, since word lines and bit lines are pre-charged at an intermediate voltage even while data is being written, an excessive current is not consumed when shifting from a writing operation to a reading operation. In addition, stabilizing capacitance for a termination power source can be omitted.

In addition, according to the present invention, the direction of a current that flows in a word line connected to a tunnel magnetic resistance element to which "1" is written is reverse to the direction of that to which "0" is written. The direction of a current that flows in a bit line connected to a tunnel magnetic resistance element to which "1" is written is revere to the direction of that to which "0" is written. Thus, when "1" or "0" is written, a current flows from a selected word line to a selected bit line. When "0" or "1" is written, a current flows from a selected bit line to a selected word line. Thus, the current that flows in the power source can be remarkably decreased. As a result, the load of the power source can be remarkably alleviated.

In addition, according to the present invention, since a selector and a termination circuit of word lines or bit lines are overlapped with a tunnel magnetic resistance element, the area of the MRAM can be decreased.

In addition, according to the present invention, since one sense amplifier is shared by a plurality of cell arrays, the number of cell amplifiers can be decreased.

In addition, according to the present invention, since a voltage source of a first voltage is disposed adjacent to a sense amplifier, noise of a power source that enters a detected current can be decreased. Thus, the accuracy of the detected current can be improved.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor memory apparatus using tunnel magnetic resistance elements, the apparatus comprising:

a plurality of cell arrays, each of said cell arrays having a plurality of word lines, a plurality of bit lines each of which intersects with the plurality of word lines, and a plurality of tunnel magnetic resistance elements connected between respective word lines and respective bit lines at the intersections thereof;

means, when data is read, for connecting a read word line, which is a word line connected to a tunnel magnetic resistance element from which the data is read, to a voltage source of a first voltage;

means, when the data is read, for connecting a read bit line, which is a bit line connected to the tunnel magnetic resistance element from which data is read, to an input of a sense amplifier having an input voltage that is a second voltage that is different from the first voltage;

means, when the data is read, for causing word lines, except for the read word line, in a first cell array that contains the tunnel magnetic resistance element from which data is read to be in a floating state; and means, when the data is read, for causing bit lines, except for the read bit line, in the first cell array to be in a floating state.

2. The semiconductor memory apparatus as set forth in claim 1, further comprising:

a subtracter for subtracting an offset current from a current that flows to or from the sense amplifier when the data is read.

3. The semiconductor memory apparatus as set forth in claim 2, wherein the offset current flows in a dummy cell.

4. The semiconductor memory apparatus as set forth in claim 3, wherein said dummy cell is included in a second cell array that is different from the first cell array.

5. The semiconductor memory apparatus as set forth in claim 4, wherein the second cell array is a cell array dedicated for generating the offset current.

6. The semiconductor memory apparatus as set forth in claim 5, wherein in the second cell array, tunnel magnetic resistance elements to which "0" has been written and tunnel magnetic resistance elements to which "1" has been written are arranged in a checker shape.

7. The semiconductor memory apparatus as set forth in claim 5, wherein in the second cell array, tunnel magnetic resistance elements to which "0" has been written and tunnel magnetic resistance elements to which "1" has been written are arranged in a stripe pattern.

8. The semiconductor memory apparatus as set forth in claim 5, wherein in the second cell array, the difference between the number of tunnel magnetic resistance elements to which "0" has been written and the number of tunnel magnetic resistance elements to which "1" has been written is 1 or less.

9. The semiconductor memory apparatus as set forth in claim 4, wherein the second cell array is a cell array that contains a tunnel magnetic resistance element from and to which data is read and written.

10. The semiconductor memory apparatus as set forth in claim 9, wherein the second cell array has a dummy word line and a dummy bit line, and wherein a current that flows in the dummy bit line is used as the offset current when the dummy word line is connected to the voltage source of the first voltage, the dummy bit line is connected to said subtracter, word lines that are contained in the second cell array and that are not the dummy word line are caused to be in a floating state, and bit lines that are contained in the second cell array and that are not the dummy bit line are caused to be in a floating state.

11. The semiconductor memory apparatus as set forth in claim 10, wherein the difference between the number of tunnel magnetic resistance elements to which "0" has been written and that are connected to the dummy word line and the number of tunnel magnetic resistance elements to which "1" has been written and that are connected to the dummy word line is 1 or less.

12. The semiconductor memory apparatus as set forth in claim 10, wherein the difference between the number of tunnel magnetic resistance elements to which "0" has been written and that are connected to the dummy bit line and the number of tunnel magnetic resistance elements to which "1" has been written and that are connected to the dummy bit line is 1 or less.

13. The semiconductor memory apparatus as set forth in claim 9, wherein the second cell array has a dummy word line, and wherein a current that flows in the bit line connected to said subtracter is used as the offset current when the dummy word line is connected to the voltage source of the first voltage, any one bit line of the second cell array is connected to said subtracter, word lines that are contained in the second cell array and that are not the dummy word line are caused to be in a floating state, and bit lines that are contained in the second cell array and that are not the bit line connected to said subtracter are caused to be in a floating state.

14. The semiconductor memory apparatus as set forth in claim 13, wherein the difference between the number of tunnel magnetic resistance elements to which "0" has been written and that are connected to the dummy word line and the number of tunnel magnetic resistance elements to which "1" has been written and that are connected to the dummy word line is 1 or less.

15. The semiconductor memory apparatus as set forth in claim 9, wherein the second cell array has a dummy bit line, and wherein a current that flows in the dummy bit line is used as the offset current when any one word line contained in the second cell array is connected to the voltage source of the first voltage, the dummy bit line is connected to said subtracter, word lines that are contained in the second cell array and that are not connected to the voltage source of the first voltage are caused to be in a floating state, and bit lines that are contained in the second cell array and that are not the dummy bit line are caused to be in a floating state.

16. The semiconductor memory apparatus as set forth in claim 15, wherein the difference between the number of tunnel magnetic resistance elements to which "0" has been written and that are connected to the dummy bit line and the number of tunnel magnetic resistance elements to which "1" has been written and that are connected to the dummy bit line is 1 or less.

17. The semiconductor memory apparatus as set forth in claim 1, further comprising:

an integrator for integrating a current that flows to or from the sense amplifier.

18. The semiconductor memory apparatus as set forth in claim 1, further comprising:

means for performing a self-reference reading method.

19. The semiconductor memory apparatus as set forth in claim 1, wherein before the data is read, each word line and each bit line are pre-charged at a third voltage that is different from the first voltage and the second voltage.

20. The semiconductor memory apparatus as set forth in claim 19, wherein the third voltage is represented by:

$$(nV1+mV2)/(m+n)$$

where V1 represents the first voltage; V2 represents the second voltage; m represents the number of word lines per cell array; and n represents the number of bit lines per cell array.

21. The semiconductor memory apparatus as set forth in claim 1, further comprising:

means, when data is written, for causing the voltage of each word line and each bit line to be a third voltage that is different from the first voltage and the second voltage.

22. The semiconductor memory apparatus as set forth in claim 21, wherein the third voltage is represented by:

$$(nV1+mV2)/(m+n)$$

where V1 represents the first voltage; V2 represents the second voltage; m represents the number of word lines per cell array; and n represents the number of bit lines per cell array.

23. The semiconductor memory apparatus as set forth in claim 1, wherein the direction of a current that flows in a word line connected to a tunnel magnetic resistance element to which "1" is written is reverse to the direction of a current that flows in a word line connected to a tunnel magnetic resistance element to which "0" is written, and wherein the direction of a current that flows in a bit line connected to a tunnel magnetic resistance element to which "1" is written is reverse to the direction of a current that flows in a bit line connected to a tunnel magnetic resistance element to which "0" is written.

24. The semiconductor memory apparatus as set forth in claim 1, wherein a selector and a termination circuit of word lines or bit lines are overlapped with the tunnel magnetic resistance elements.

25. The semiconductor memory apparatus as set forth in claim 1, wherein the sense amplifier is shared by a plurality of cell arrays.

26. The semiconductor memory apparatus as set forth in claim 1, wherein the voltage source of the first voltage is disposed adjacent to the sense amplifier.

* * * * *